(12) United States Patent
Kimura et al.

(10) Patent No.: US 8,461,615 B2
(45) Date of Patent: Jun. 11, 2013

(54) SEMICONDUCTOR LIGHT EMITTING DEVICE

(75) Inventors: Shigeya Kimura, Kanagawa-ken (JP); Taisuke Sato, Kanagawa-ken (JP); Toshihide Ito, Tokyo (JP); Toshiyuki Oka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 12/875,632

(22) Filed: Sep. 3, 2010

(65) Prior Publication Data
US 2011/0215363 A1   Sep. 8, 2011

(30) Foreign Application Priority Data
Mar. 8, 2010   (JP) .................. 2010-051165

(51) Int. Cl.
   *H01L 33/00*   (2010.01)
(52) U.S. Cl.
   USPC .............. 257/99; 257/E33.062; 257/E33.065
(58) Field of Classification Search
   USPC ............................. 257/99, E33.062, E33.065
   See application file for complete search history.

(56) References Cited

U.S. PATENT DOCUMENTS

| | | | |
|---|---|---|---|
| 7,193,245 B2 | 3/2007 | Zhao et al. | |
| 7,531,841 B2 * | 5/2009 | Ko et al. | 257/79 |
| 7,642,183 B2 * | 1/2010 | Zhao et al. | 438/609 |
| 7,928,451 B2 * | 4/2011 | Bilenko et al. | 257/91 |
| 2005/0133807 A1 * | 6/2005 | Park et al. | 257/99 |
| 2011/0147784 A1 * | 6/2011 | Brockley et al. | 257/99 |

FOREIGN PATENT DOCUMENTS

| | | |
|---|---|---|
| CN | 1630110 A | 6/2005 |
| JP | 2001-308380 | 11/2001 |
| JP | 2001-345480 | 12/2001 |
| JP | 3369089 | 11/2002 |
| JP | 2003-69074 | 3/2003 |
| JP | 2004-228554 | 8/2004 |
| JP | 2008-159957 | 7/2008 |
| JP | 2010-199395 | 9/2010 |
| JP | 2011-129890 | 6/2011 |
| WO | WO 2009/057311 A1 | 5/2009 |

OTHER PUBLICATIONS

Office Action issued Nov. 16, 2011 in Japan Application No. 2010-051165 (With English Translation).
U.S. Appl. No. 13/032,943, filed Feb. 23, 2011, Kimura, et al.

(Continued)

*Primary Examiner* — Benjamin Sandvik
(74) *Attorney, Agent, or Firm* — Oblon, Spivak, McClelland, Maier & Neustadt, L.L.P.

(57) ABSTRACT

According to one embodiment, a semiconductor light emitting device includes a stacked structural body, a first electrode, and a second electrode. The stacked structural body includes a first semiconductor layer of a first conductivity type, a second semiconductor layer of a second conductivity type, and a light emitting portion. The stacked structural body has a first major surface on a side of the second semiconductor layer. The first electrode is provided on the first semiconductor. The second electrode is provided on the second semiconductor layer. The first electrode includes a first pad portion and a first extending portion that extends from the first pad portion along a first extending direction. The first extending portion includes a first width-increasing portion. A width of the first width-increasing portion along a direction orthogonal to the first extending direction is increased from the first pad portion toward an end of the first extending portion.

6 Claims, 23 Drawing Sheets

OTHER PUBLICATIONS

U.S. Appl. No. 13/029,462, filed Feb. 17, 2011, Sato, et al.

Office Action issued Oct. 31, 2011 in Korean Patent Application No. 10-2010-0087506 (with English translation).

Chinese Office Action issued on Dec. 26, 2012, in Chinese Patent Application No. 201010274410.7 (with English Translation).

* cited by examiner

112

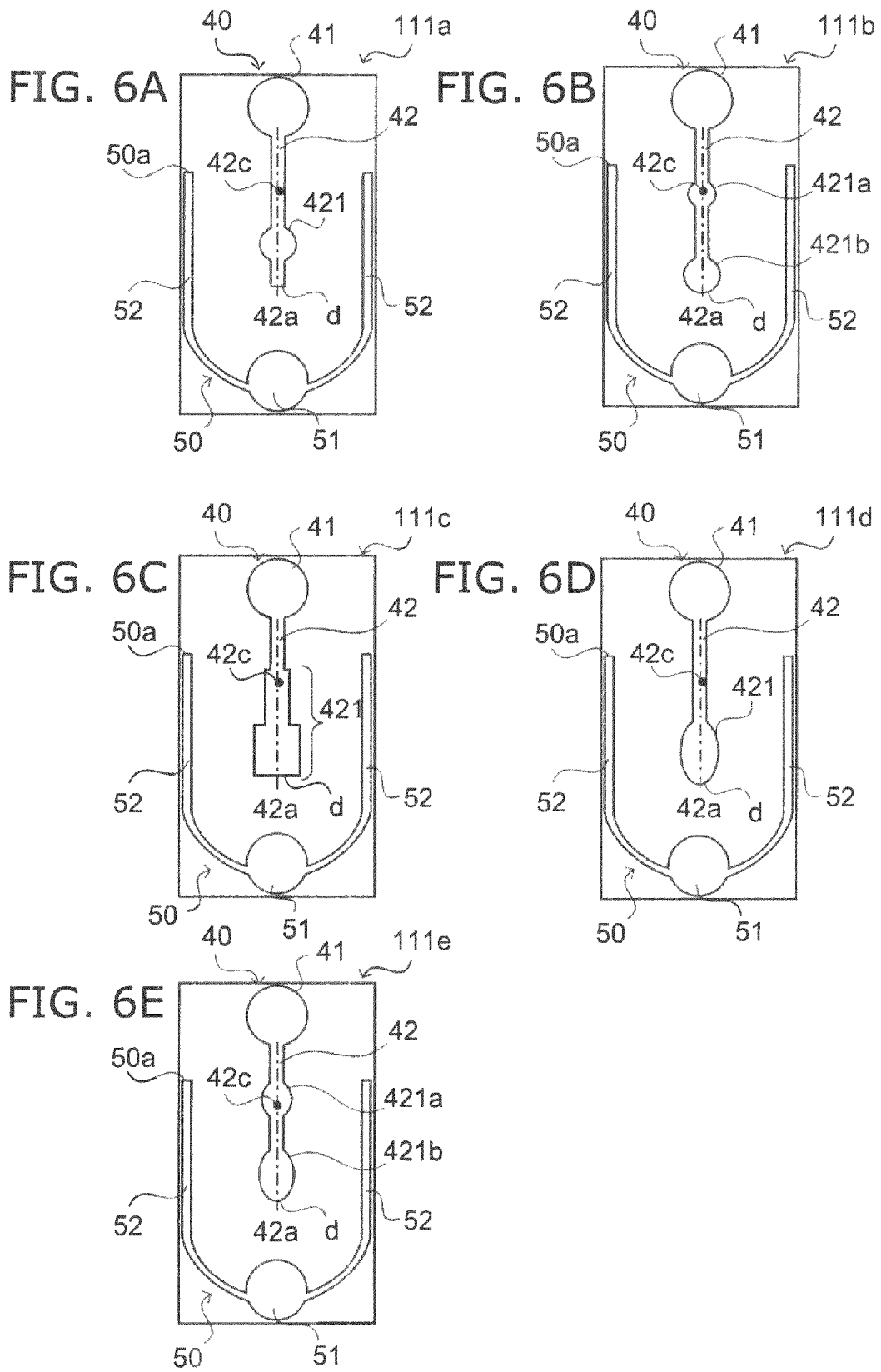

131

132

SEMICONDUCTOR LIGHT EMITTING DEVICE

CROSS-REFERENCE TO RELATED APPLICATIONS

This application is based upon and claims the benefit of priority from the prior Japanese Patent Application No. 2010-051165, filed on Mar. 8, 2010; the entire contents of which are incorporated herein by reference.

FIELD

Embodiments described herein relate generally to a semiconductor light emitting device.

BACKGROUND

Taking advantage of its characteristics of having a wide band gap, a nitrogen-based group III-V compound semiconductor such as gallium nitrogen (GaN) is applied to light emitting devices such as light emitting diodes (LEDs) which emit high-luminance light of ultraviolet to blue and green and laser diodes (LDs) which emit light of blue purple to blue.

Such a semiconductor light emitting device is provided with a p-side electrode and an n-side electrode. There are two types in arrangement of the electrodes: a "face-up type" in which the p-side electrode and the n-side electrode are arranged on the same side of the semiconductor light emitting device; and a "flip chip type" in which the p-side electrode and the n-side electrode are respectively arranged on opposite sides of the semiconductor light emitting device.

A "face-up type" semiconductor light emitting device can be easily mounted onto a package. However, current density distribution in the device is likely to be non-uniform, and accordingly the device is likely to have non-uniform light emission distribution.

In JP-A 2001-345480 (Kokai), a group III nitrogen-based compound semiconductor device is described. In the device having an outermost diameter of 700 µm or more, a distance between an n electrode and a point of a p electrode farthest from the n electrode is 500 µm or less. Further, various shapes of electrodes are proposed.

However, even though such a conventional technology is used, there is room for improvement in fully achieved uniformity in light emission distribution.

BRIEF DESCRIPTION OF THE DRAWINGS

The patent or application file contains at least one drawing executed in color. Copies of this patent or patent application publication with color drawings will be provided by the Office upon request and payment of the necessary fee.

FIGS. 6A to 8 are schematic plan views showing semiconductor light emitting devices;

DETAILED DESCRIPTION

Figure 1:
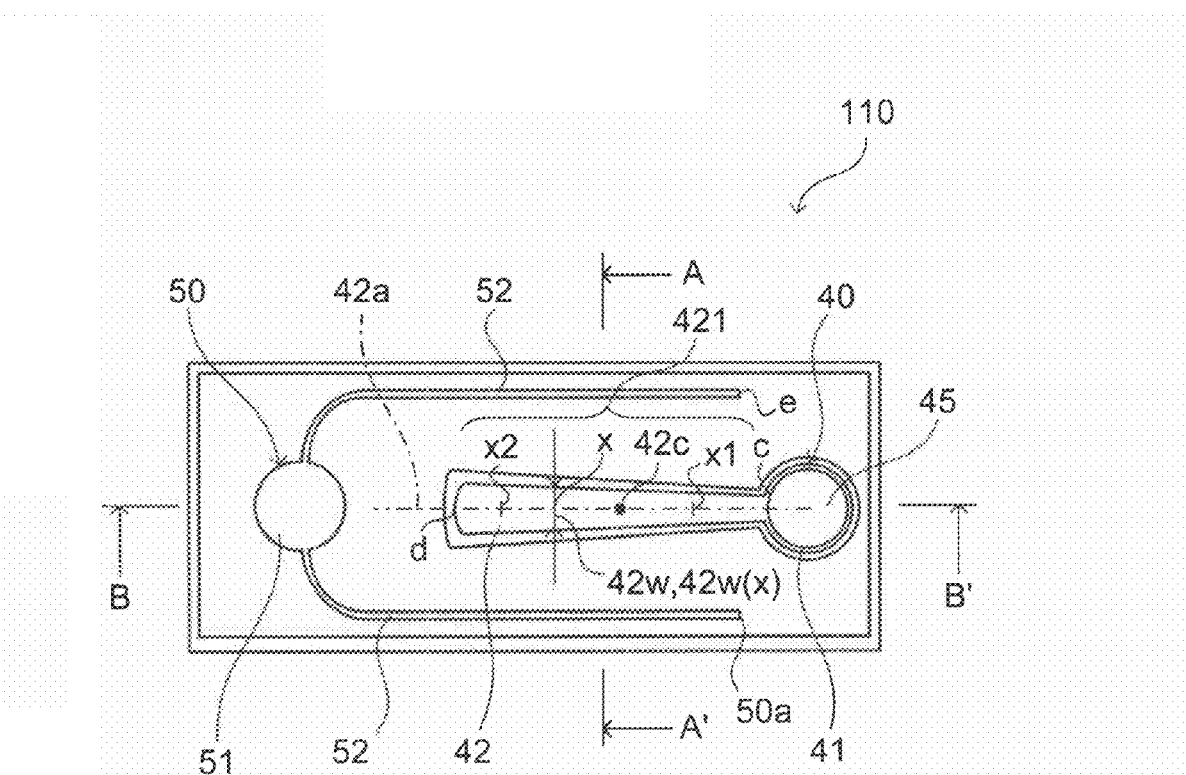
FIG. 1 is a schematic plan view showing a semiconductor light emitting device.

In general, according to one embodiment, a semiconductor light emitting device includes a stacked structural body, a first electrode, and a second electrode. The stacked structural body includes a first semiconductor layer of a first conductivity type, a second semiconductor layer of a second conductivity type, and a light emitting portion. The first semiconductor layer having a major face, a first portion provided on the major face and a second portion provided on the major face. The second semiconductor layer provided on the first portion. The light emitting portion is provided between the first portion of the first semiconductor layer and the second semiconductor layer. The first electrode is provided on the second portion of the first semiconductor layer. The second electrode is provided on the second semiconductor layer. The first electrode includes a first pad portion and a first extending portion. The first extending portion extends from the first pad portion along a first extending direction. The first extending portion includes a first width-increasing portion. A width of the first width-increasing portion along a direction orthogonal to the first extending direction is increased from the first pad portion toward an end of the first extending portion.

According to another embodiment, a semiconductor light emitting device includes a stacked structural body, a first electrode, and a second electrode. The stacked structural body includes a first semiconductor layer of a first conductivity type, a second semiconductor layer of a second conductivity type, and a light emitting portion. The first semiconductor layer having a major face, a first portion provided on the major face and a second portion provided on the major face. The second semiconductor layer provided on the first portion. The light emitting portion is provided between the first portion of the first semiconductor layer and the second semiconductor layer. The first electrode is provided on the second portion of the first semiconductor layer. The second electrode is provided on the second semiconductor layer. The first electrode includes a first pad portion and a first extending portion. The first extending portion extends from the first pad portion along a first extending direction. The first extending portion includes a first width-decreasing portion. A width of the first width-decreasing portion along a direction orthogonal to the first extending direction is decreased from the first pad portion toward an end of the first extending portion. A distance between the first pad portion and an end portion of the second electrode closest to the first pad portion is longer than a distance between the first pad portion and a center of the first extending portion along the first extending direction.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

FIG. 1 is a schematic plan view illustrating the configuration of a semiconductor light emitting device according to a first embodiment.

Figure 2:
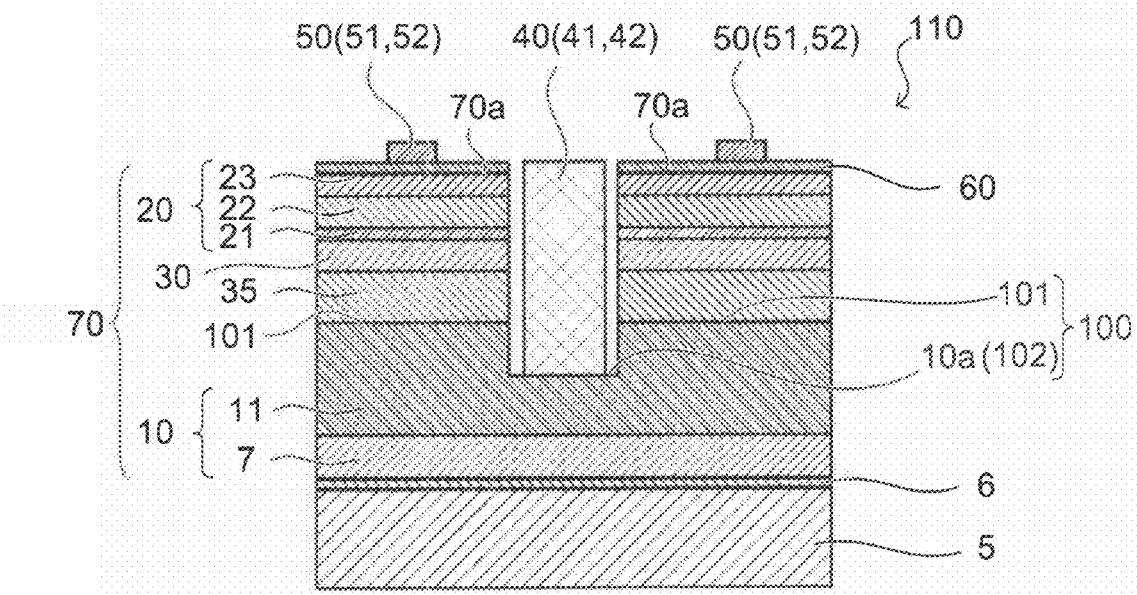
FIG. 2 is a schematic cross-sectional view taken along line A-A' as indicated by arrows in FIG. 1.

FIG. 2 is a schematic cross-sectional view taken along line A-A' as indicated by arrows in FIG. 1.

Figure 3:
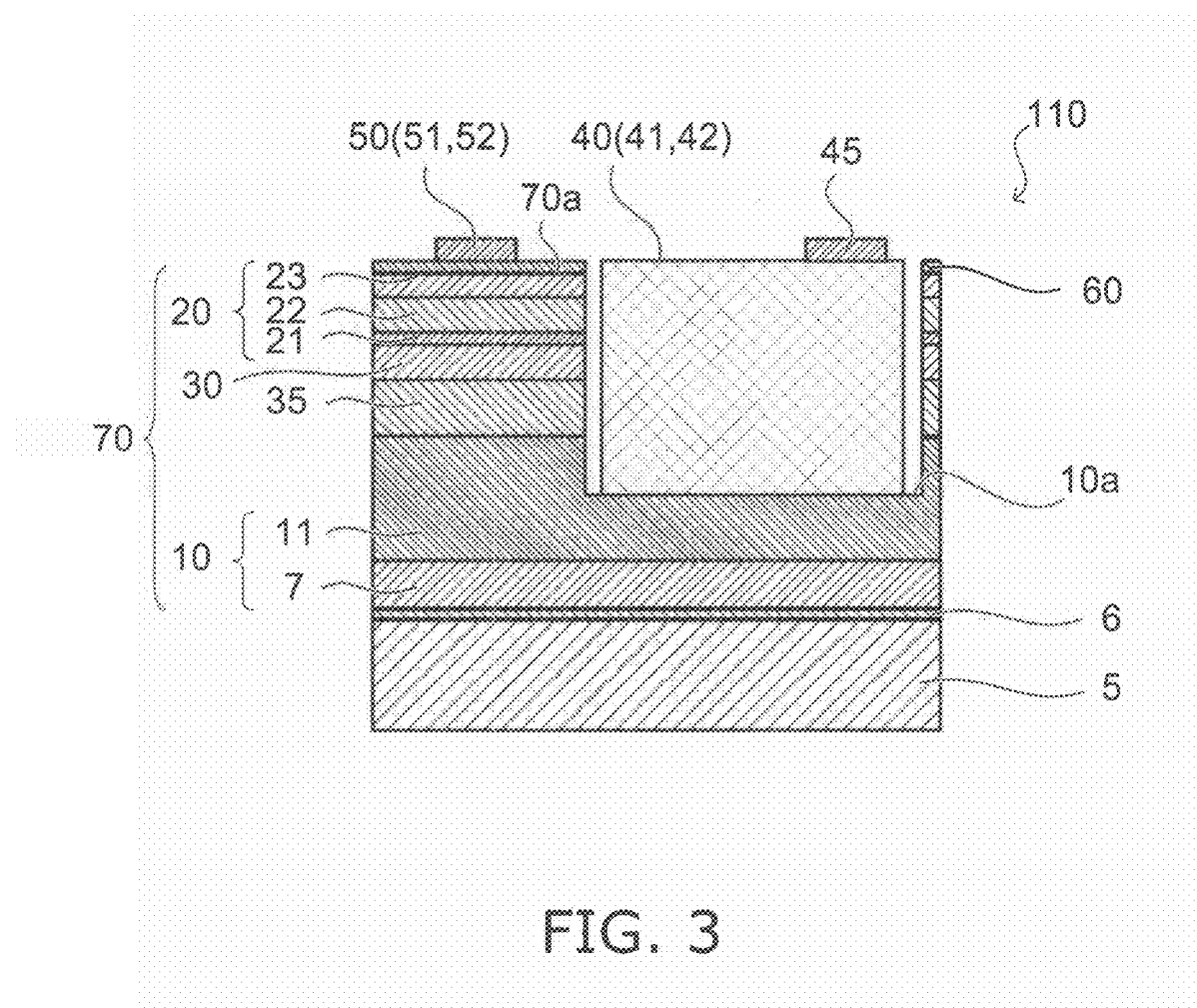
FIG. 3 is a schematic cross-sectional view taken along line B-B' as indicated by arrows in FIG. 1.

FIG. 3 is a schematic cross-sectional view taken along line B-B' as indicated by arrows in FIG. 1.

As shown in FIG. 2, a semiconductor light emitting device 110 according to this embodiment includes a stacked structural body 70, a first electrode 40, and a second electrode 50. The stacked structural body 70 includes a first semiconductor layer 10 of a first conductivity type, a second semiconductor layer 20 of a second conductivity type, and a light emitting portion 30 provided between the first semiconductor layer 10 and the second semiconductor layer 20. The first electrode 40 is provided on an exposed surface (a first contact surface 10a) of the first semiconductor layer 10 in the first major surface 70a of the stacked structural body 70 on the second semiconductor layer 20 side. The second electrode 50 is provided in a part of the second semiconductor layer 20 on the first major surface 70a.

The first semiconductor layer 10 having a major face 100, a first portion 101 provided on the major face 100 and a second portion 102 provided on the major face 100. The second semiconductor layer 20 provided on the first portion 101. The light emitting portion 30 is provided between the first portion 101 of the first semiconductor layer 10 and the second semiconductor layer 20. The first electrode 40 is provided on the second portion 102 of the first semiconductor layer 10. The second portion 102 is also the first contact surface 10a. The second electrode 50 is provided on the second semiconductor layer 20.

An active layer having, for example, a single quantum well structure or a multiple quantum well structure may be used for the light emitting portion 30. For example, a nitride-based semiconductor may be used for the first semiconductor layer 10, the second semiconductor layer 20, and the light emitting portion 30.

Here, the first conductivity type is, for example, an n-type, and the second conductivity type is, for example, a p-type. However, this embodiment is not limited to this. The first conductivity type may be the p-type, and the second conductivity type may be the n-type. Hereinbelow, a description is given on the assumption that the first conductivity type is the n-type and the second conductivity type is the p-type.

The first electrode 40 is provided on the first contact surface 10a. At least the second semiconductor layer 20 and the light emitting portion 30 are selectively removed on the first major surface 70a side of the stacked structural body 70, and the first semiconductor layer 10 is exposed from the first contact surface 10a on the first major surface 70a. The second electrode 50 is provided in a part of the second semiconductor layer 20 on the first major surface 70a side.

The first electrode 40 includes a first pad portion 41 and a first extending portion 42. The first extending portion 42 extends from the first pad portion 41. That is, the first pad portion 41 and the first extending portion 42 are connected to each other.

In this specific example, the semiconductor light emitting device 110 further includes a pad electrode 45 provided on the to first pad portion 41. That is, the first pad portion 41 is arranged between the first semiconductor layer 10 and the pad electrode 45 to which an external wiring is connected, for example, by a bonding wire. The first pad portion 41 is in contact with, for example, the first contact surface 10a of the first semiconductor layer 10. The size of the first pad portion 41 is equal to or larger than, for example, that of the pad electrode 45, in a plan view.

The first extending portion 42 extends from, for example, the first pad portion 41 along the first contact surface 10a. A direction (an first extending direction 42a) in which the first extending portion 42 extends from the first pad portion 41 is a direction in which the first extending portion 42 extends from the first pad portion 41 along the first contact surface 10a. For example, when the first extending portion 42 extends linearly, the extending direction 42a is a linear direction. When the first extending portion 42 includes a curved portion, the extending direction 42a is a direction of extending along the curve in the curved portion.

The first extending portion 42 is in contact with, for example, the first contact surface 10a of the first semiconductor layer 10. The first extending portion 42 may be provided integrally with the first pad portion 41, or may be provided separately. In this embodiment, a description is given of an example in which the first extending portion 42 is provided integrally with the first pad portion 41.

The second electrode 50 includes a second pad portion 51 and second extending portions 52. The second pad portion 51 is, for example, a portion to which an external wiring is connected by a bonding wire. The second extending portions 52 are provided to extend from the second pad portion 51 along the first major surface 70a. The second extending portions 52 may be provided integrally with the second pad portion 51, or may be provided separately. In this embodiment, the second extending portions 52 are provided integrally with the second pad portion 51.

In the second electrode 50 illustrated in FIG. 1, the multiple second extending portions 52 are provided to extend from the second pad portion 51. For example, the two second extending portions 52 extend from the second pad portion 51. The two second extending portions 52 respectively extend from the second pad portion 51 in directions different from each other (opposite directions in this concrete example), are curved midway, and then extend along the circumferential edge of the semiconductor device 110. The first extending portion 42 of the first electrode 40 is arranged between the two second extending portions 52. That is, the second electrode 50 includes: a second pad portion 51, a second extending portion (one of the second extending portions 52), and a third extending portion (another one of the second extending portions 52). The second extending portion (one of the second extending portions 52) extends from the second pad portion. At least a part of the second extending portion extends along a second extending direction. The third extending portion (another one of the second extending portions 52) extends from the second pad portion. At least a part of the third extending portion extends along a third extending direction different from the second extending direction.

In the second electrode 50 illustrated in FIG. 1, an end portion 50a of the second electrode 50 closest to the first pad portion 41 of the first electrode 40 is located closer to the first pad portion 41 than a center position 42c of the first extending portion 42 in the extending direction 42a. a distance between the first pad portion 41 and the end portion 50a of the second electrode 50 closest to the first pad portion 41 is less than a distance between the first pad portion 41 and the center portion 42c along the extending direction 42a.

In the semiconductor light emitting device 110 according to this embodiment described above, the first extending portion 42 includes a width-increasing portion (a first width-increasing portion) 421. The width-increasing portion 421 is a portion in which a width 42w of the first extending portion 42 is gradually increased from the first pad portion 41 toward an end d of the first extending portion 42. The width 42w of the first extending portion 42 is a length of the first extending portion 42 in a direction orthogonal to the extending direction 42a on the first contact surface 10a.

As illustrated in FIG. 1, the width-increasing portion 421 is provided in almost the entire first extending portion 42 in the semiconductor light emitting device 110. The width-increasing portion 421 may be provided in a part of the first extending portion 42. In the first extending portion 42 illustrated in FIG. 1, the width 42w of the width-increasing portion 421 is increased continuously. The width 42w of the width-increasing portion 421 may be increased continuously, or may be increased discontinuously (stepwise).

In the semiconductor light emitting device 110 according to the first embodiment described above, the current density distribution between the first electrode 40 and the second electrode 50 is deconcentrated, and thus uniformity in light emission distribution is achieved.

Hereinbelow, a specific example of the semiconductor light emitting device 110 according to this embodiment will be described.

As shown in FIGS. 2 and 3, in the semiconductor light emitting device 110, for example, a buffer layer 6 is provided on a major surface (for example, a C surface) of a substrate 5 made of, for example, sapphire, and, for example, an undoped GaN layer 7 and an n-type GaN contact layer 11 are provided thereon. The n-type GaN contact layer 11 is included in the first semiconductor layer 10. It may be considered that the GaN layer 7 is included in the first semiconductor layer 10 for descriptive purposes.

A multiply stacked body 35 is provided on the n-type GaN contact layer 11. For example, multiple first layers are alternately stacked with multiple second layers in the multiply stacked body 35. The multiply stacked body 35 has, for example, a superlattice structure.

The light emitting portion 30 (active layer) is provided on the multiply stacked body 35. The light emitting portion 30 has, for example, a multiple quantum well (MQW) structure. In other words, the light emitting portion 30 has a structure in which multiple barrier layers are alternately and repeatedly stacked with multiple well layers.

A p-type AlGaN layer 21, a p-type layer, e.g., an Mg-doped GaN layer 22, and a p-type GaN contact layer 23 are provided in this order on the light emitting portion 30. The p-type AlGaN layer 21 has a function of, for example, an electron overflow protective layer. The p-type AlGaN layer 21, the Mg-doped GaN layer 22, and the p-type GaN contact layer are included in the second semiconductor layer 20. Moreover, a transparent electrode 60 is provided on the p-type GaN contact layer 23.

A part of the n-type GaN contact layer 11, i.e., the first semiconductor layer 10, and parts of the respective multiply stacked body 35, the light emitting portion 30, and the second semiconductor layer 20 corresponding to the part of the n-type GaN contact layer 11 are removed. The first electrode 40 is provided on the first contact surface 10a from which the n-type GaN contact layer 11 is exposed.

A stacked structure of, for example, Ti/Al/Ta/Ti/Pt is used for the first electrode 40 (the first pad portion 41 and the first extending portion 42). The pad electrode 45 is provided on the first pad portion 41 of the first electrode 40. A stacked structure of, for example, Ni/Au is used for the pad electrode 45. As illustrated in FIG. 1, the first electrode 40 includes the width-increasing portion 421.

On the other hand, the second electrode 50 is provided on a part of the transparent electrode 60. The second electrode 50 includes the second pad portion 51 and the second extending portions 52. A stacked structure of, for example, Ni/Au is used for the second electrode 50 (the second pad portion 51 and the second extending portions 52).

The aforementioned materials used for the first electrode 40 (the first pad portion 41 and the first extending portion 42), the pad electrode 45, and the second electrode 50 (the second pad portion 51 and the second extending portions 52) are mere examples, and this embodiment is not limited thereto.

As described above, the semiconductor light emitting device 110 of this specific example according to this embodiment is a light emitting diode (LED).

The width-increasing portion 421 is provided in the first electrode 40 of the semiconductor light emitting device 110 according to this embodiment. Thus, the current density distribution between the first electrode 40 and the second electrode 50 is deconcentrated, and uniformity in light emission distribution is achieved.

Here, a specific example of the first electrode 40 and the second electrode 50 will be described.

As illustrated in FIG. 1, the first electrode 40 includes the first pad portion 41 and the first extending portion 42. The first pad portion 41 can have various shapes such as a circle, rectangle, and a horse shoe, for example. In the case where the first pad portion 41 has a rectangular shape, the first pad portion 41 preferably has curved corners.

When the first pad portion 41 has a circular shape, the first pad portion 41 can have a diameter of approximately not less than 50 μm and not more than 100 μm, for example. When the first pad portion 41 has the rectangular shape, the first pad portion 41 can have a side of approximately not less than 50 μm and not more than 100 μm, for example. The first pad portion 41 can have a thickness of approximately not less than 100 nm and not more than 500 nm, and it is preferably approximately 300 nm.

The pad electrode 45 made of Ni/Au or the like is formed on the first pad portion 41 for connecting a bonding wire thereto. The size of the pad electrode 45 is equal to or smaller than, for example, that of the first pad portion 41 of the first electrode 40.

The first extending portion 42 is provided to extend from the first pad portion 41 in a thin line shape. The first extending portion 42 may be provided in plurality. The first extending portion 42 extends from the first pad portion 41 in a radial direction, for example. The first extending portion 42 includes the width-increasing portion 421.

Here, a joint position of the first pad portion 41 and the first extending portion 42 is defined as a joint portion c; an end position of the first extending portion 42 is defined as an end d; and a width 42w of the first extending portion 42 at an arbitrary point x on a segment cd is defined as 42w(x).

The width 42w(x) of the first extending portion 42 is preferably equal to or smaller than the size of the first pad portion 41, i.e., approximately 100 μm or less. From a viewpoint of a resistance value, the width 42w(x) is preferably approximately 5 μm or more. More specifically, the width 42w(x) is preferably not less than 10 μm and not more than 100 μm.

As illustrated in FIG. 1, the two second extending portions 52 extend from the second pad portion 51 of the second electrode 50 toward the first pad portion 41 of the first electrode 40. In this case, when a distance of a segment ec between an end e of each of the second extending portions 52 and the joint portion c of the first pad portion 41 is shorter than a distance of a segment ed between the end d of the first extending portion 42 and the end e of the second extending portion 52, the width 42w of the first extending portion 42 is changed so that, in the segment cd, a relation between a point x1 which is a first position close to the first pad portion 41 and a point x2 which is a second position close to the end d of the first extending portion 42 can be $42w(x1)<42w(x2)$.

By changing the width $42w(x)$ of the first extending portion 42 in the extending direction 42a as described above, in the semiconductor light emitting device 110 according to the first embodiment, the current density distribution between the first electrode 40 and the second electrode 50 is deconcentrated, and uniformity in light emission distribution is achieved.

Comparative Examples

Figure 4A:
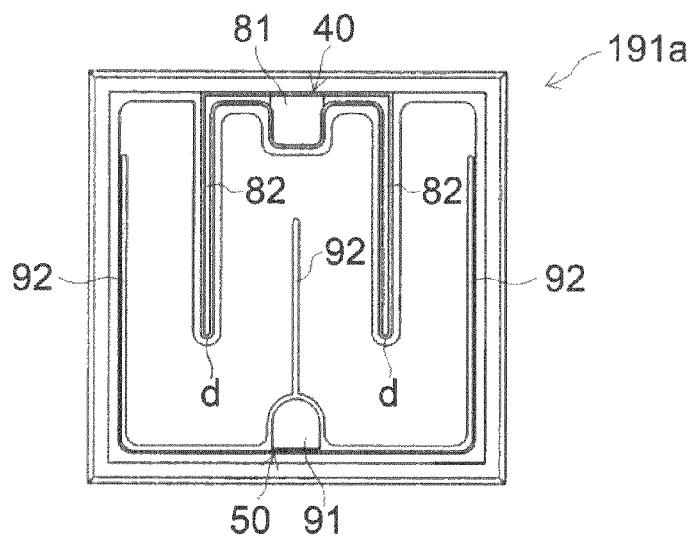
FIGS. 4A to 4C are schematic plan views illustrating semiconductor light emitting devices according to comparative examples.
Figure 4B:
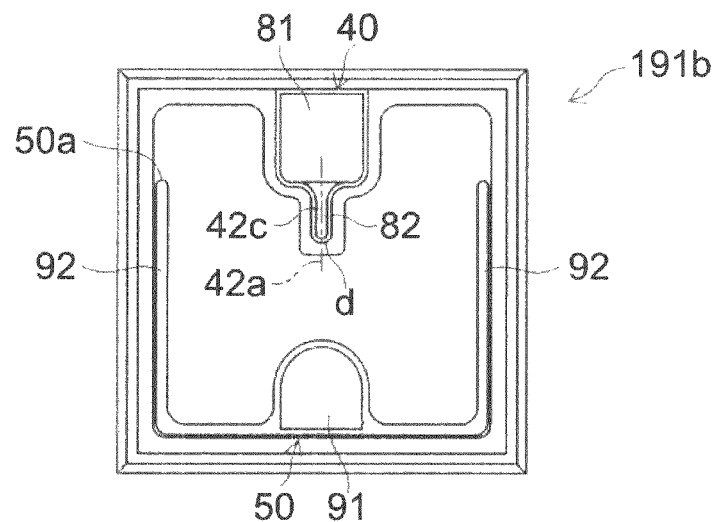
Figure 4C:
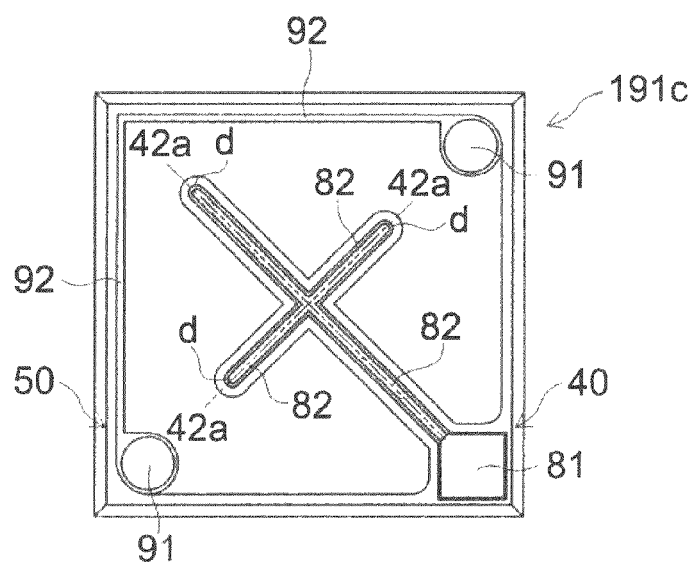

FIGS. 4A to 4C are schematic plan views respectively illustrating semiconductor light emitting devices according to comparison examples.

FIGS. 4A to 4C each schematically show the plan shapes of a first electrode and a second electrode in the corresponding one of the semiconductor light emitting devices. FIG. 4A shows a semiconductor light emitting device 191a according to a first comparative example. FIG. 4B shows a semiconductor light emitting device 191b according to a second comparative example. FIG. 4C shows a semiconductor light emitting device 191c according to a third comparative example.

As shown in FIG. 4A, in the semiconductor light emitting device 191a according to the first comparative example, a first electrode 40 includes a first pad portion 81 and two first extending portions 82 extending from the first pad portion 81. A second electrode 50 includes a second pad portion 91 and three second extending portions 92 extending from the second pad portion 91. The first extending portions 82 and the second extending portions 92 face each other in such a manner that the second extending portions 92 and the first extending portions 82 are nested inside one another.

In the semiconductor light emitting device 191a, the first extending portion 82 of the first electrode 40 has a constant width in a direction orthogonal to an extending direction 42a of the first extending portion 82.

As shown in FIG. 4B, in the semiconductor light emitting device 191b according to the second comparative example, a first electrode 40 includes a first pad portion 81 and a first extending portion 82 extending from the first pad portion 81 toward a second electrode 50. The second electrode 50 includes a second pad portion 91 and two second extending portions 92 extending from the second pad portion 91. The two second extending portions 92 of the second electrode 50 extend from the second pad portion 91 in directions opposite to each other. The second extending portions 92 are provided along a circumference of the semiconductor light emitting device 191b.

In the semiconductor light emitting device 191b, the first extending portion 82 of the first electrode 40 has a constant width in a direction orthogonal to an extending direction 42a of the first extending portion 82 in a central portion of the first extending portion 82 except a base portion thereof connecting with the first pad portion 81 and an end portion thereof.

Moreover, in the second electrode 50, an end portion 50a of the second electrode 50 closest to the first pad portion 81 of the first electrode 40 is located closer to the first pad portion 81 than a center position 42c of the first extending portion 82 of the first electrode 40 in the extending direction 42a.

The base portion and the end portion of the first extending portion 82 of the first electrode 40 are provided with a round shape. The base portion connects with the first pad portion 81. The provision of the round shape causes the width of the first extending portion 82 of the first electrode 40 to be changed in the base portion and the end portion. The width is decreased with the increase of a distance from the first pad portion 81.

As shown in FIG. 4C, in the semiconductor light emitting device 191c according to the third comparative example, a first electrode 40 includes a first pad portion 81 and a first extending portion 82 extending from the first pad portion 81. A second electrode 50 includes two second pad portions 91 and a second extending portion 92 which connects the two second pad portions 91 and extends along a circumference of the semiconductor light emitting device 191c.

In the semiconductor light emitting device 191c, the first extending portion 82 of the first electrode 40 extends from the first pad portion 81 and branches midway, that is, branches midway in three extending directions 42a. Each branch of the first extending portions 82 has a constant width in a direction orthogonal to a corresponding one of the extending directions 42a.

FIGS. 5A to 5H are diagrams illustrating characteristics of semiconductor light emitting devices, respectively.

FIGS. 5A to 5D illustrate simulation results of light emission distribution in plan views of the semiconductor light emitting devices, respectively. FIGS. 5A to 5D each show that a more densely hatched portion has a higher light emission intensity.

In addition, FIG. 5E to FIG. 5H illustrate simulation results of current distribution in plan views of the semiconductor light emitting devices, respectively. FIGS. 5E to 5H each show a direction and the magnitude of a current by using a direction and the length of an arrow, respectively.

Figure 5A:
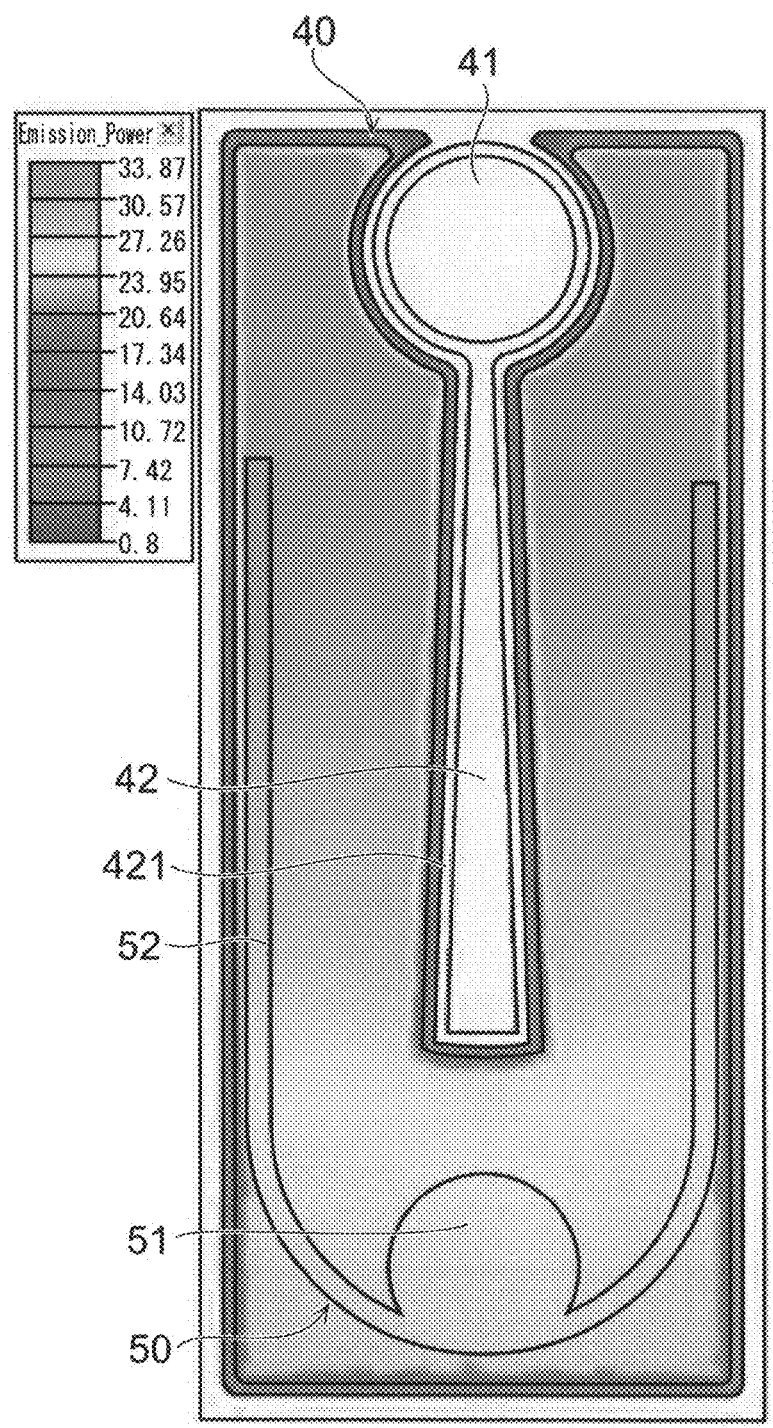
FIGS. 5A to 5H are diagrams showing characteristics of semiconductor light emitting devices.
Figure 5B:
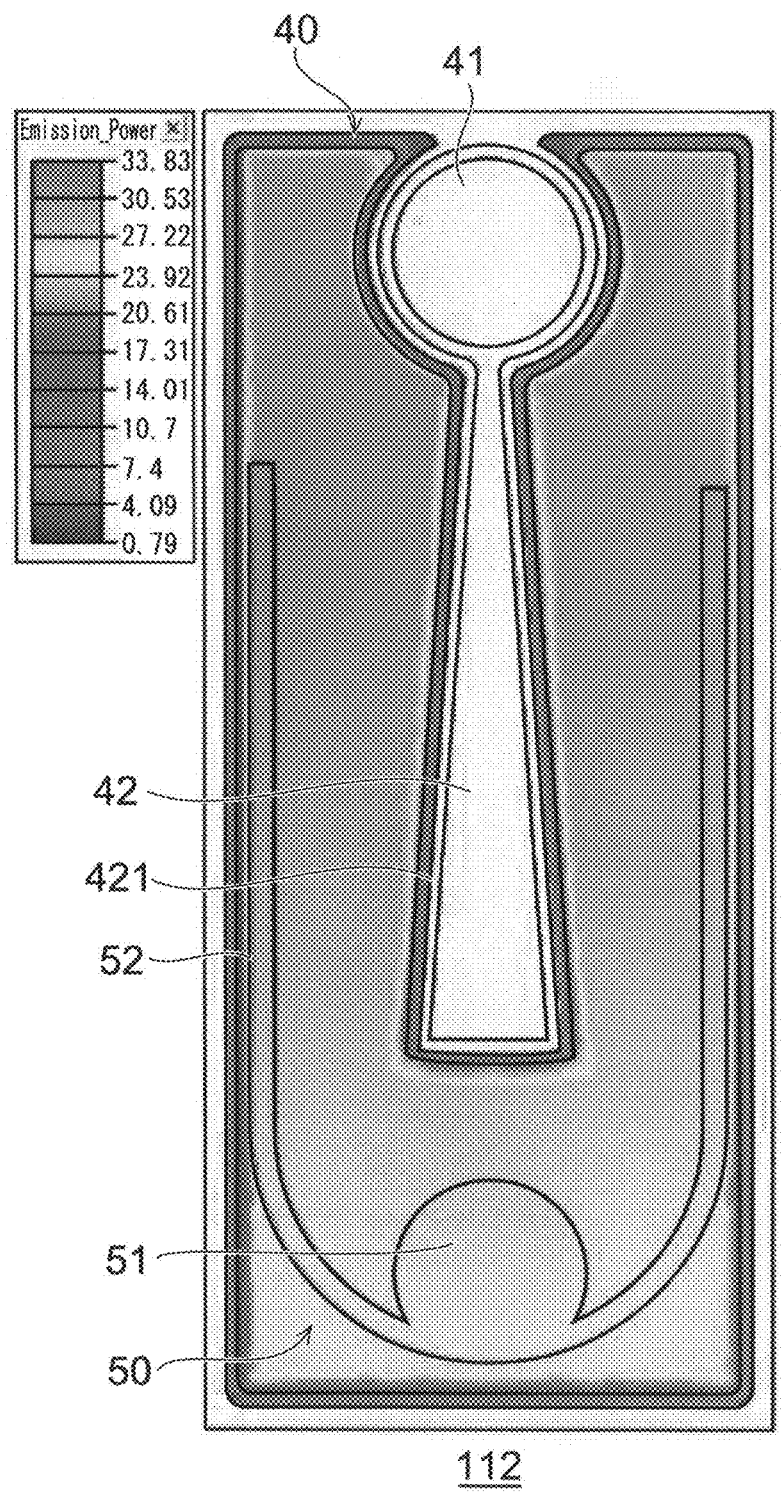
Figure 5C:
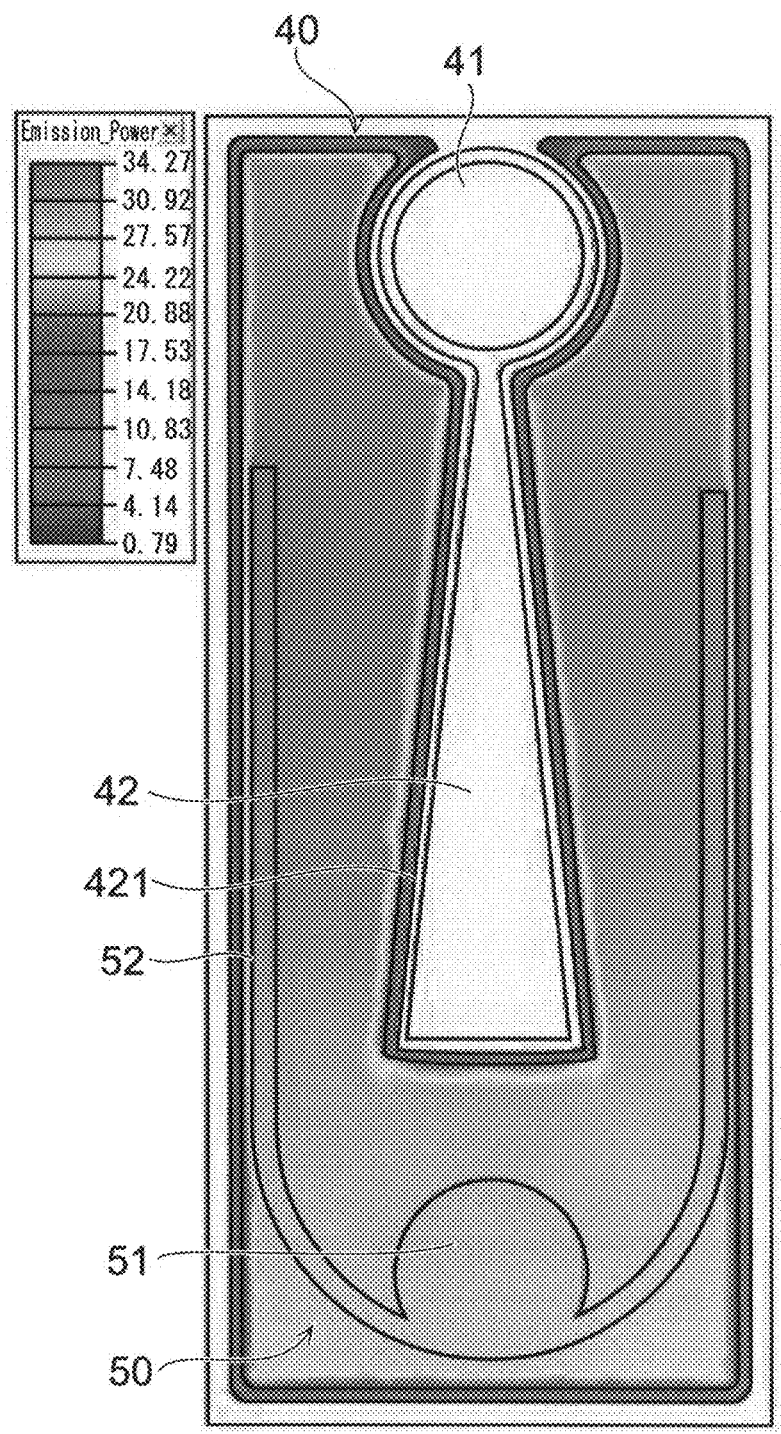
Figure 5D:
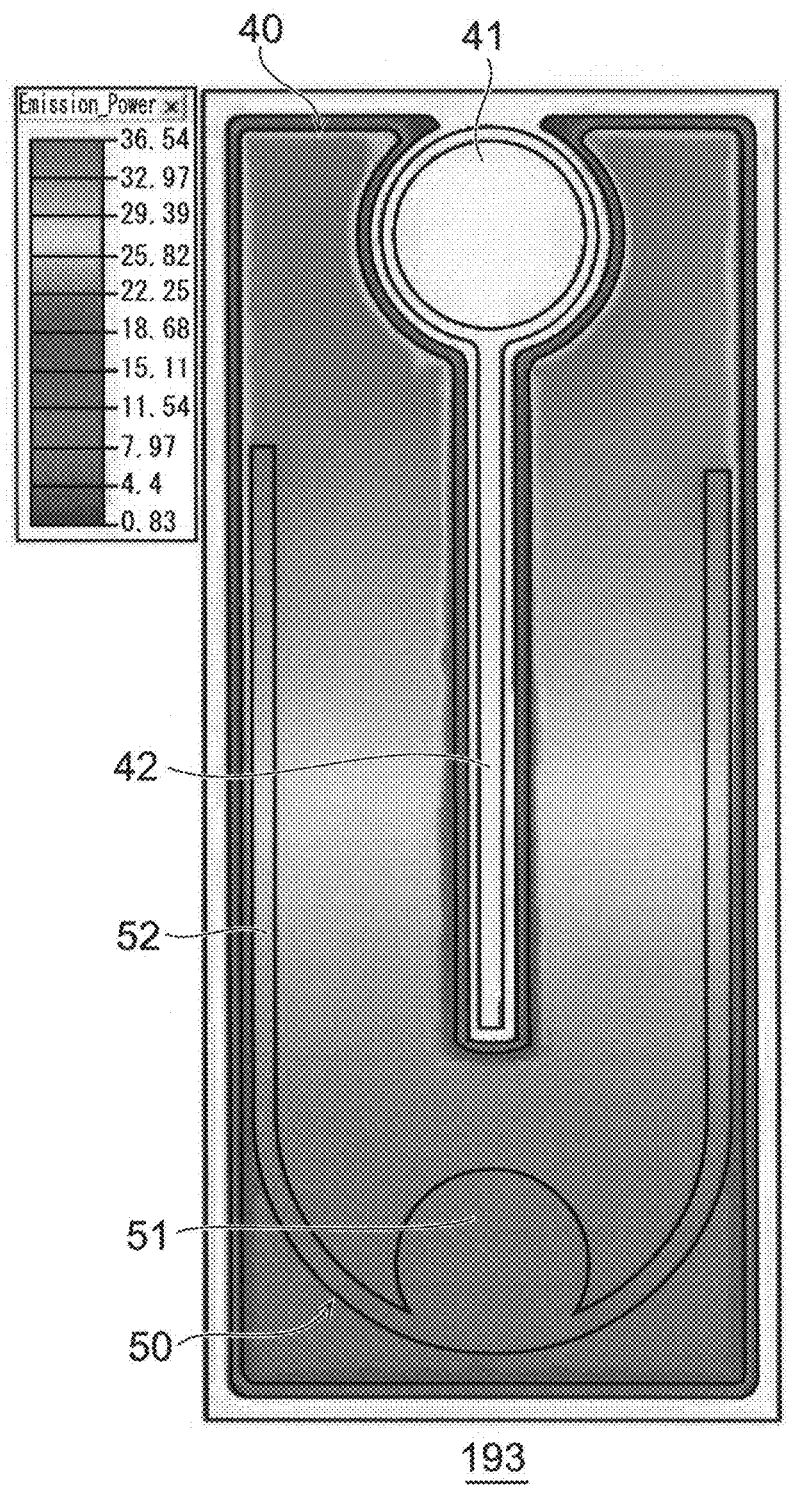
Figure 5E:
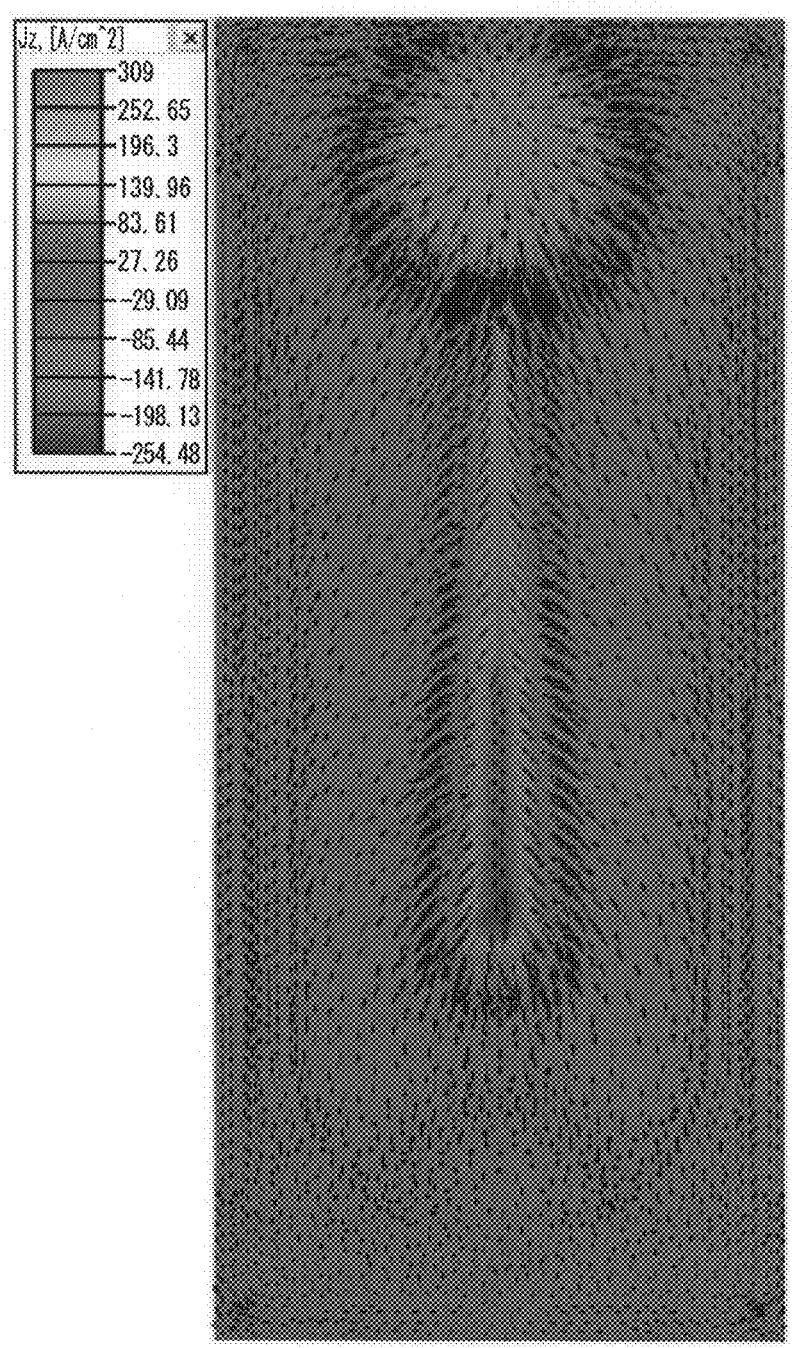
Figure 5F:
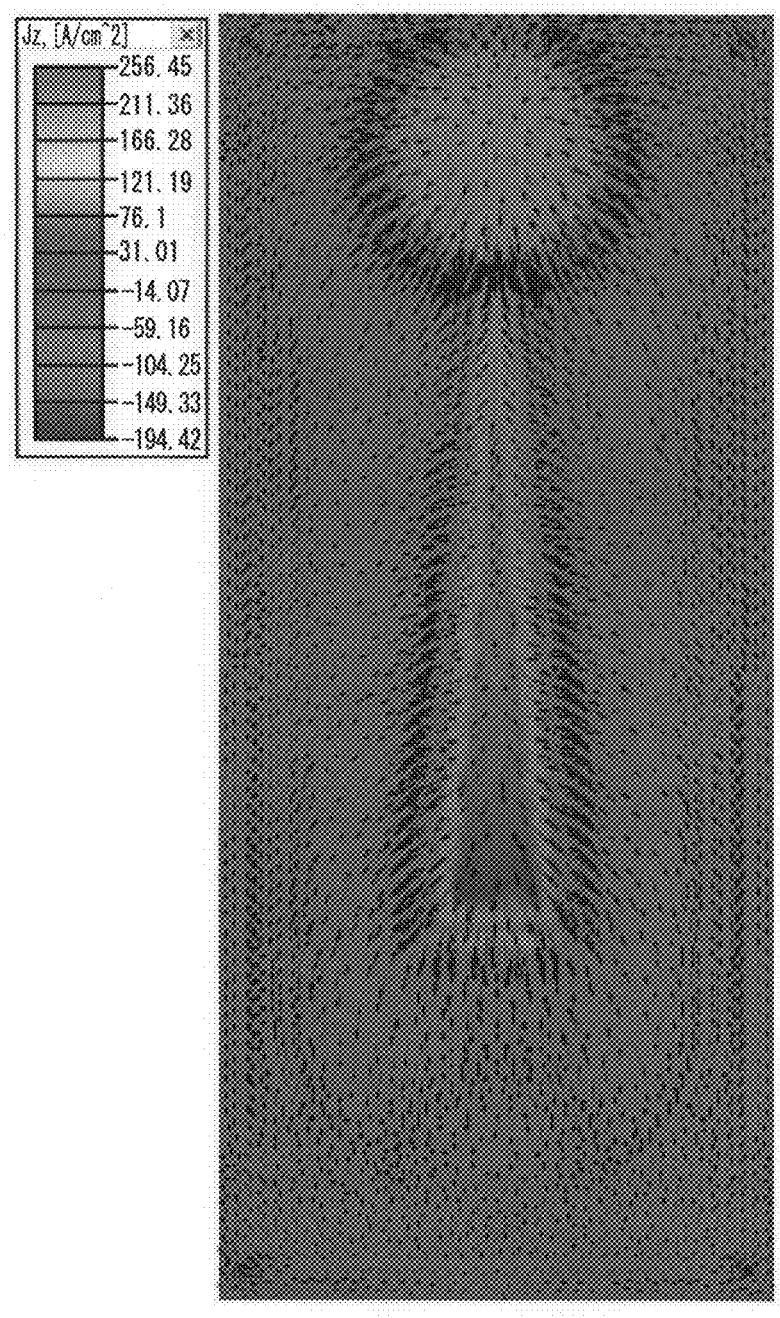
Figure 5G:
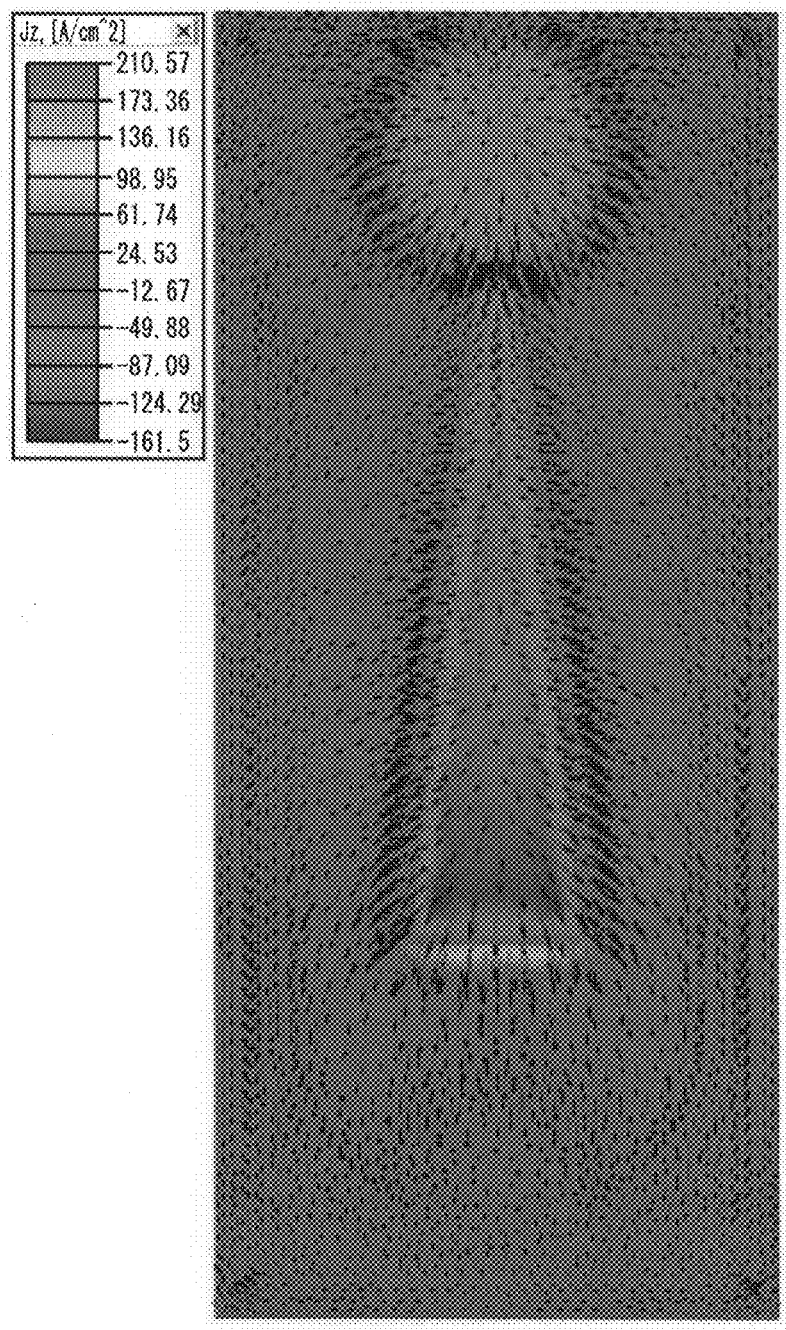

FIGS. 5A and 5E correspond to a semiconductor light emitting device 111 in which a degree of increasing a width of a width-increasing portion 421 of a first extending portion 42 is a first degree. FIGS. 5B and 5F correspond to a semiconductor light emitting device 112 in which a degree of increasing a width of a width-increasing portion 421 of a first extending portion 42 is a second degree larger than the first degree. FIGS. 5C and 5G correspond to a semiconductor light emitting device 113 in which a degree of increasing a width of a width-increasing portion 421 of a first extending portion 42 is a third degree larger than the second degree. The semiconductor light emitting devices 111, 112 and 113 are the semiconductor light emitting devices according to the first embodiment. In contrast, FIGS. 5D and 5H correspond to a semiconductor light emitting device 193 of a fourth comparative example in which a width of a first extending portion 42 of a first electrode 40 is constant.

As shown in FIG. 5D, the density of the hatched portion changes largely in the semiconductor light emitting device 193 of the fourth comparative example. In other words, the light emission intensity changes largely in the plane of the semiconductor light emitting device 193. In contrast, the semiconductor light emitting devices 111, 112 and 113 each have a large area of a densely hatched portion, high light emission intensity, and uniform light emission distribution. In addition, as shown in FIGS. 5A to 5C, it is found that a higher degree of increasing the width of the width-increasing portion 421 shows wider light emission distribution.

Figure 5H:
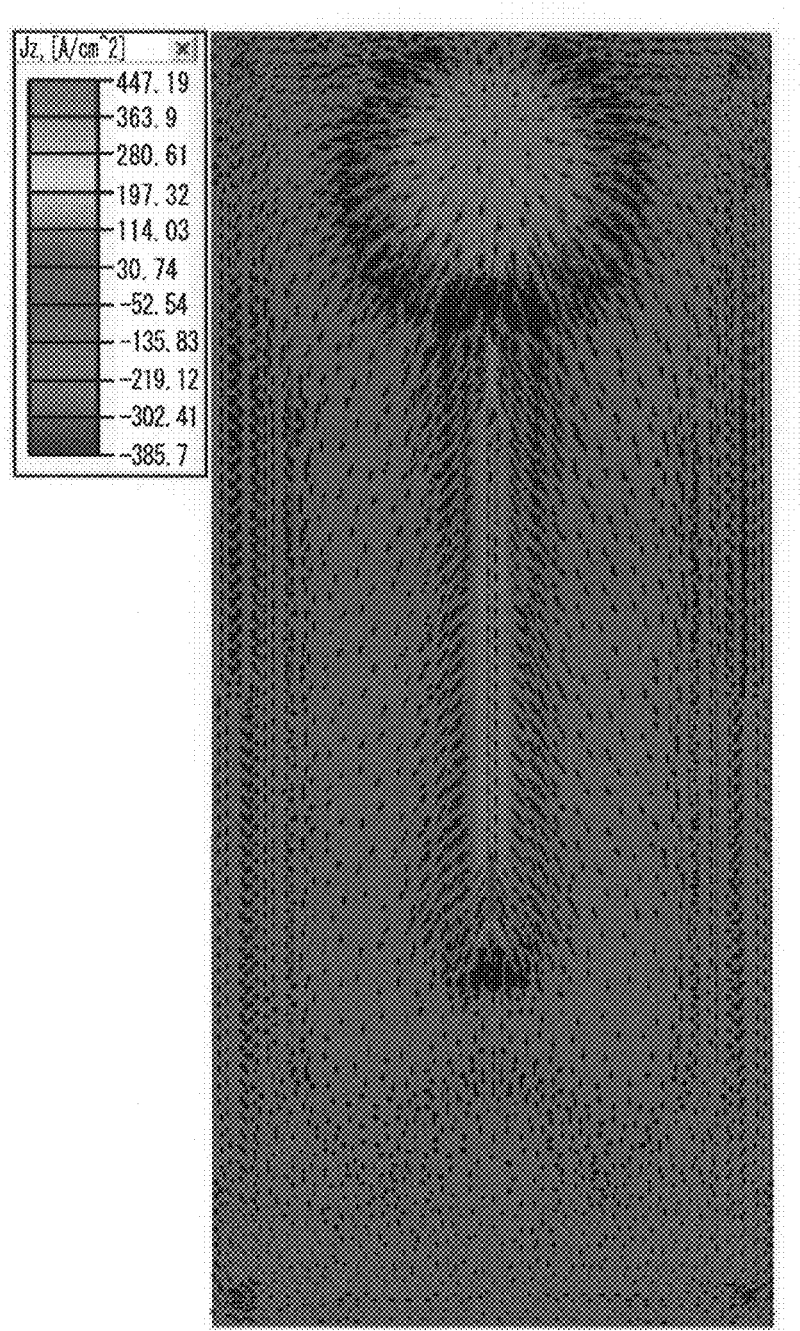

As shown in FIG. 5H, the current distribution of the semiconductor light emitting device 193 of the fourth comparative example is concentrated remarkably on a specific portion. Specifically, the current distribution is concentrated on the first pad portion 41 of the first electrode 40. In contrast, as shown in FIGS. 5E to 5G, the concentration of the current distribution is suppressed in the semiconductor light emitting devices 111, 112, and 113. In addition, as shown in FIGS. 5E to 5G, the current is distributed in a wide range of the first extending portion 42 of the first electrode 40 as the degree of increasing of the width of the width-increasing portion 421 is increased.

With reference to an operating voltage of the semiconductor light emitting device 193 of the fourth comparative example, the semiconductor light emitting device 111 has an operating voltage of 0.988; the semiconductor light emitting device 112 has an operating voltage of 0.981; and the semiconductor light emitting device 113 has an operating voltage of 0.981.

As described above, in the semiconductor light emitting device 110 (111, 112, and 113) according to the first embodiment, the decentralization of the current density distribution between the first electrode 40 and the second electrode 50 can be achieved as compared to the semiconductor light emitting device 193 in which the width-increasing portion 421 is not provided in the first extending portion 42 of the first electrode 40. Thereby, uniformity in light emission distribution is achieved in the semiconductor light emitting device 110 (111, 112, and 113).

FIGS. 6A to 7D are schematic plan views respectively illustrating the configurations of other semiconductor light emitting devices according to the first embodiment.

FIGS. 6A to 7D each illustrate plan shapes of a first electrode 40 and a second electrode 50.

In each of semiconductor light emitting devices 111*a* to 111*e* illustrated in FIGS. 6A to 6E, a single first extending portion 42 extends from a first pad, portion 41 of the first electrode 40. In each of semiconductor light emitting devices 112*a* to 112*d* illustrated in FIGS. 7A to 7D, two first extending portions 42 extend from a first pad portion 41 of the first electrode 40.

In each of the semiconductor light emitting devices 111*a* to 112*d* illustrated in FIGS. 6A to 7D, an end portion 50*a* of the second electrode 50 closest to the first pad portion 41 of the first electrode 40 is located closer to the first pad portion 41 than a center position 42*c* of the first extending portion 42 in an extending direction 42*a*. Accordingly, in a width-increasing portion 421, a width 42*w* of the first extending portion 42 is gradually increased from the first pad portion 41 toward an end d of the first extending portion 42.

As shown in FIG. 6A, the semiconductor light emitting device 111*a* has a circular expanded portion midway through the first extending portion 42. A half of the expanded portion on the first pad portion 41 side serves as a width-increasing portion 421. In other words, the length (width) in a direction orthogonal to the extending direction 42*a* of the width-increasing portion 421 is increased along the curves from the first pad portion 41 toward the end d.

As shown in FIG. 6B, the semiconductor light emitting device 111*b* has circular expanded portions respectively midway through and on the end d side of the first extending portion 42. Halves of the respective expanded portions on the first pad portion 41 side serve as width-increasing portions 421*a* and 421*b*. In other words, the lengths (widths) in a direction orthogonal to the extending direction 42*a* of the width-increasing portions 421*a* and 421*b* are increased along the curves from the first pad portion 41 toward the end d.

As shown in FIG. 6C, the semiconductor light emitting device 111*c* has rectangular expanded portions respectively midway through and on the end d side of the first extending portion 42. The rectangular expanded portions have widths increased stepwise toward the end d. In other words, the rectangular expanded portions serve as a width-increasing portion 421. The length (width) in a direction orthogonal to the extending direction 42*a* of the width-increasing portion 421 is increased stepwise from the first pad portion 41 toward the end d.

As shown in FIG. 6D, the semiconductor light emitting device 111*d* has an elliptic expanded portion on the end d side of the first extending portion 42. A half of the expanded portion on the first pad portion 41 side serves as a width-increasing portion 421. In other words, the length (width) in a direction orthogonal to the extending direction 42*a* of the width-increasing portion 421 is increased along the curves from the first pad portion 41 toward the end d.

As shown in FIG. 6E, the semiconductor light emitting device 111*e* has elliptic expanded portions respectively midway through and on the end d side of the first extending portion 42. Halves of the respective expanded portions on the first pad portion 41 side serve as width-increasing portions 421*a* and 421*b*, respectively. In other words, the lengths (widths) in a direction orthogonal to the extending direction 42*a* of the width-increasing portions 421*a* and 421*b* are increased along the curves from the first pad portion 41 toward the end d.

Figure 7A:
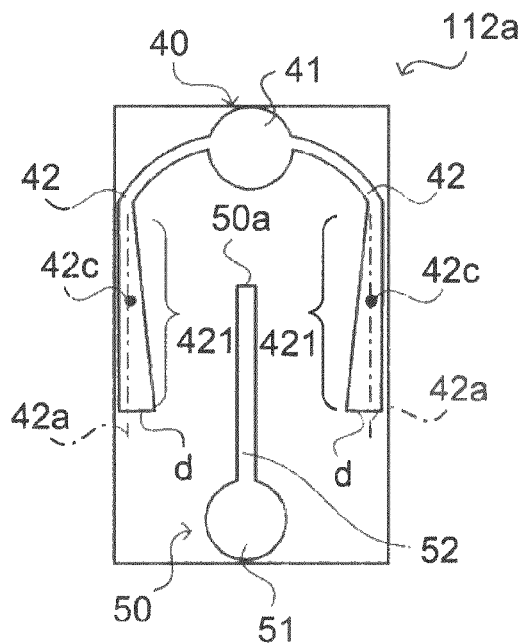

As shown in FIG. 7A, in the semiconductor light emitting device 112*a*, each of the two first extending portions 42 extending from the first pad portion 41 of the first electrode 40 is provided with a width-increasing portion 421. The length (width) in a direction orthogonal to the extending direction 42*a* of the width-increasing portion 421 is increased linearly from the first pad portion 41 toward the end d. The width of the width-increasing portion 421 may be increased along a curve, if provided. That is, the first electrode 40 further includes a fourth extending portion (one of the first extending portions 42) extending from the first pad portion along a fourth extending direction. The fourth extending portion includes a fourth width-increasing portion (one of the first width-increasing portion 421). The width of the fourth width-increasing portion along a direction orthogonal to the fourth extending direction is increased from the first pad portion toward an end of the fourth extending portion.

Figure 7B:
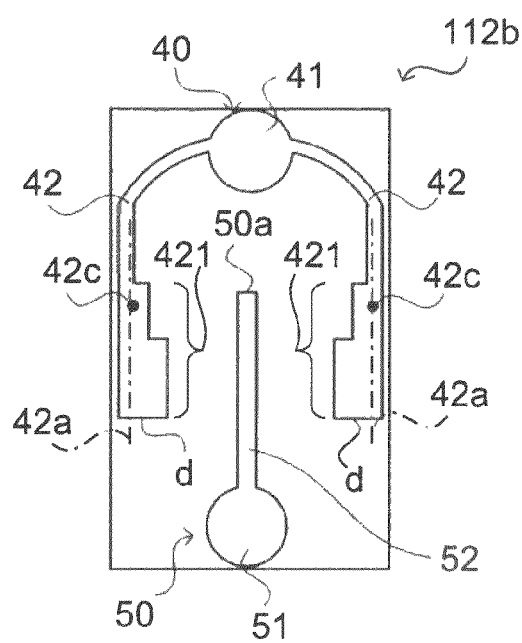

As shown in FIG. 7B, in the semiconductor light emitting device 112*b*, each of the two first extending portions 42 extending from the first pad portion 41 of the first electrode 40 is provided with rectangular expanded portions respectively midway through and on the end d side of the first extending portion 42. The rectangular expanded portions have widths increased stepwise toward the end d. In other words, the rectangular expanded portions serve as a width-increasing portion 421. The length (width) in a direction orthogonal to the extending direction 42*a* of the width-increasing portion 421 is increased stepwise from the first pad portion 41 toward the end d.

Figure 7C:
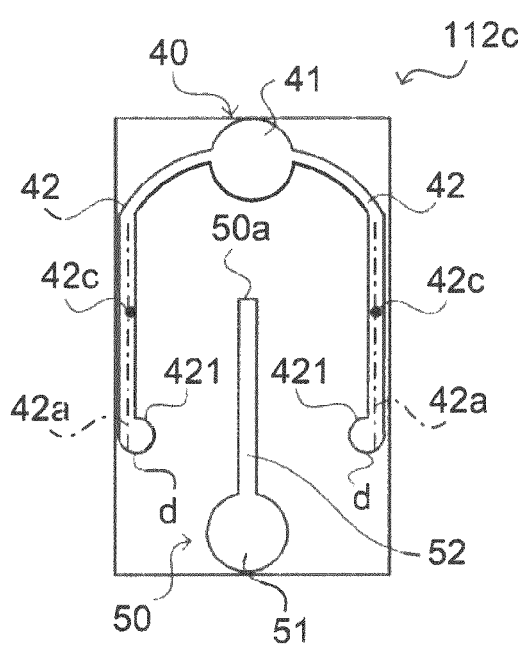

As shown in FIG. 7C, in the semiconductor light emitting device 112*c*, each of the two first extending portions 42 extending from the first pad portion 41 of the first electrode 40 is provided with a circular expanded portion on the end d side of the first extending portion 42. A half of the expanded portion on the first pad portion 41 side serves as a width-increasing portion 421. In other words, the length (width) in a direction orthogonal to the extending direction 42*a* of the width-increasing portion 421 is increased from the first pad portion 41 toward the end d. The expanded portion of the first extending portion 42 may have an elliptic shape.

Figure 7D:
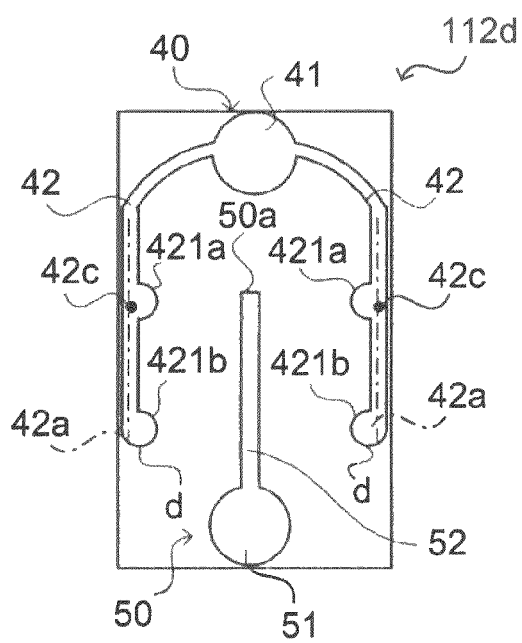

As shown in FIG. 7D, in the semiconductor light emitting device 112*d*, each of the two first extending portions 42 extending from the first pad portion 41 of the first electrode 40 is provided with circular expanded portions respectively midway through and on the end d side of the first extending portion 42. Halves of the expanded portions on the first pad portion 41 side serve as width-increasing portions 421*a* and 421*b*, respectively. In other words, the lengths (widths) in a direction orthogonal to the extending direction 42*a* of the width-increasing portions 421*a* and 421*b* are increased from the first pad portion 41 toward the end d. The expanded portions of the first extending portion 42 may have an elliptic shape. In addition, three or more expanded portions may be provided in the first extending portion 42.

Second Embodiment

Figure 8:
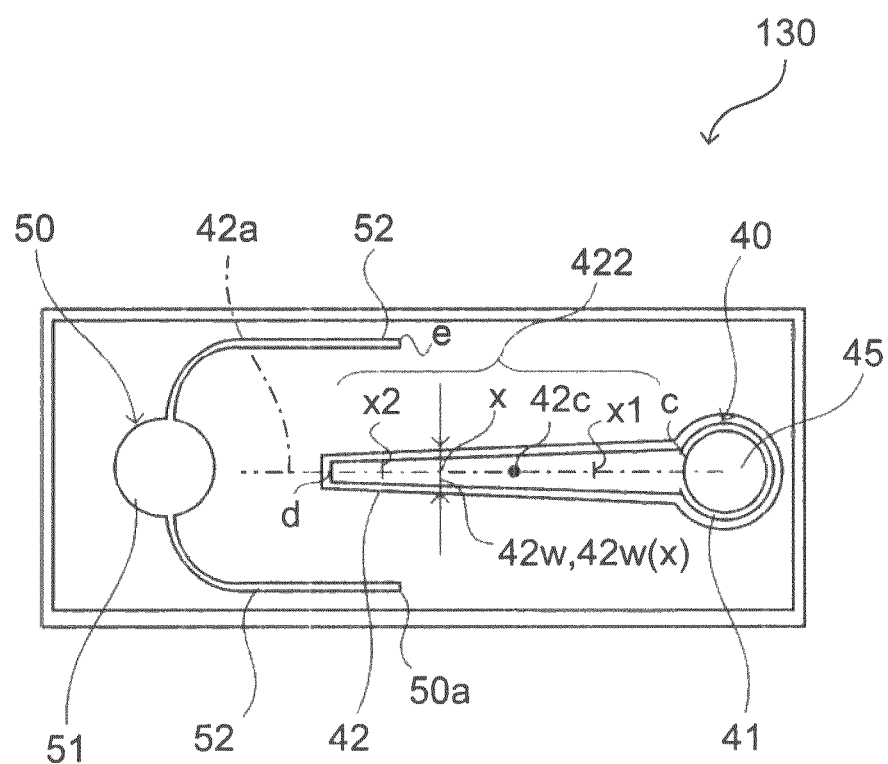

FIG. 8 is a schematic plan view illustrating the configuration of a semiconductor light emitting device according to a second embodiment.

As shown in FIG. 8, in a semiconductor light emitting device 130 according to the second embodiment, an end portion 50a in the second electrode 50 closest to a first pad portion 41 of a first electrode 40 is located farther from the first pad portion 41 than a center position 42c of the first extending portion 42 in an extending direction 42a.

That is, in the semiconductor light emitting device 130 according to the second embodiment, the position of the end portion 50a of a second extending portion 52 is different from that of the semiconductor light emitting device 110 according to the first embodiment.

Specifically, while the end portion 50a of the second electrode 50 is located closer to the first pad portion 41 than the position 42c in the semiconductor light emitting device 110 according to the first embodiment, the end portion 50a of the second electrode 50 is located farther from the first pad portion 41 than the position 42c in the semiconductor light emitting device 130 according to the second embodiment. a distance between the first pad portion 41 and the end portion 50a of the second electrode 50 closest to the first pad portion 41 being longer than a distance between the first pad portion 41 and the position 42c (a center of the first extending portion 41) along the direction 42a.

In the semiconductor light emitting device 130 according to the embodiment, the first extending portion 42 includes a width-decreasing portion (a first width-decreasing portion) 422. The width-decreasing portion 422 is a portion in which a width 42w of the first extending portion 42 is gradually decreased from the first pad portion 41 toward an end d of the first extending portion 42.

As illustrated in FIG. 8, the width-decreasing portion 422 is provided in almost the entire first extending portion 42 in the semiconductor light emitting device 130. The width-decreasing portion 422 may be provided in a part of the first extending portion 42. In the first extending portion 42 illustrated in FIG. 8, the width 42w of the width-decreasing portion 422 is decreased continuously. The width 42w of the width-decreasing portion 422 may be decreased continuously, or may be decreased discontinuously (stepwise).

Here, regarding an arbitrary point x on a segment cd connecting between a joint portion c of the first pad portion 41 and the first extending portion 42 and the end d of the first extending portion 42, the width 42w of the first extending portion 42 is defined as $42w(x)$.

The width $42w(x)$ of the first extending portion 42 is preferably smaller than the first pad portion 41, for example, approximately 100 µm or less. In addition, the width $42w(x)$ preferably has at least a minimum size in which the first extending portion 42 is manufacturable and a current is flowable, that is, approximately 5 µm or more. More specifically, the width $42w(x)$ is preferably not less than 10 µm and not more than 100 µm.

As illustrated in FIG. 8, the two second extending portions 52 extend from the second pad portion 51 of the second electrode 50 toward the first pad portion 41 of the first electrode 40. In this case, when a distance of a segment ec between an end e of the second extending portion 52 and the joint portion c of the first pad portion 41 is longer than a distance of a segment ed between the end d of the first extending portion 42 and the end e of the second extending portion 52, the width 42w of the first extending portion 42 is changed so that, in the segment cd, a relation between a point x1 which is a first position close to the first pad portion 41 and a point x2 which is a second position close to the end d of the first extending portion 42 can be $42w(x1)>42w(x2)$.

By changing the width $42w(x)$ of the first extending portion 42 in the extending direction 42a as described above, in the semiconductor light emitting device 130 according to the second embodiment, the current density distribution between the first electrode 40 and the second electrode 50 is deconcentrated, and uniformity in light emission distribution is achieved.

FIGS. 9A to 9F are diagrams illustrating characteristics of semiconductor light emitting devices of the second embodiment, respectively.

Figure 9A:
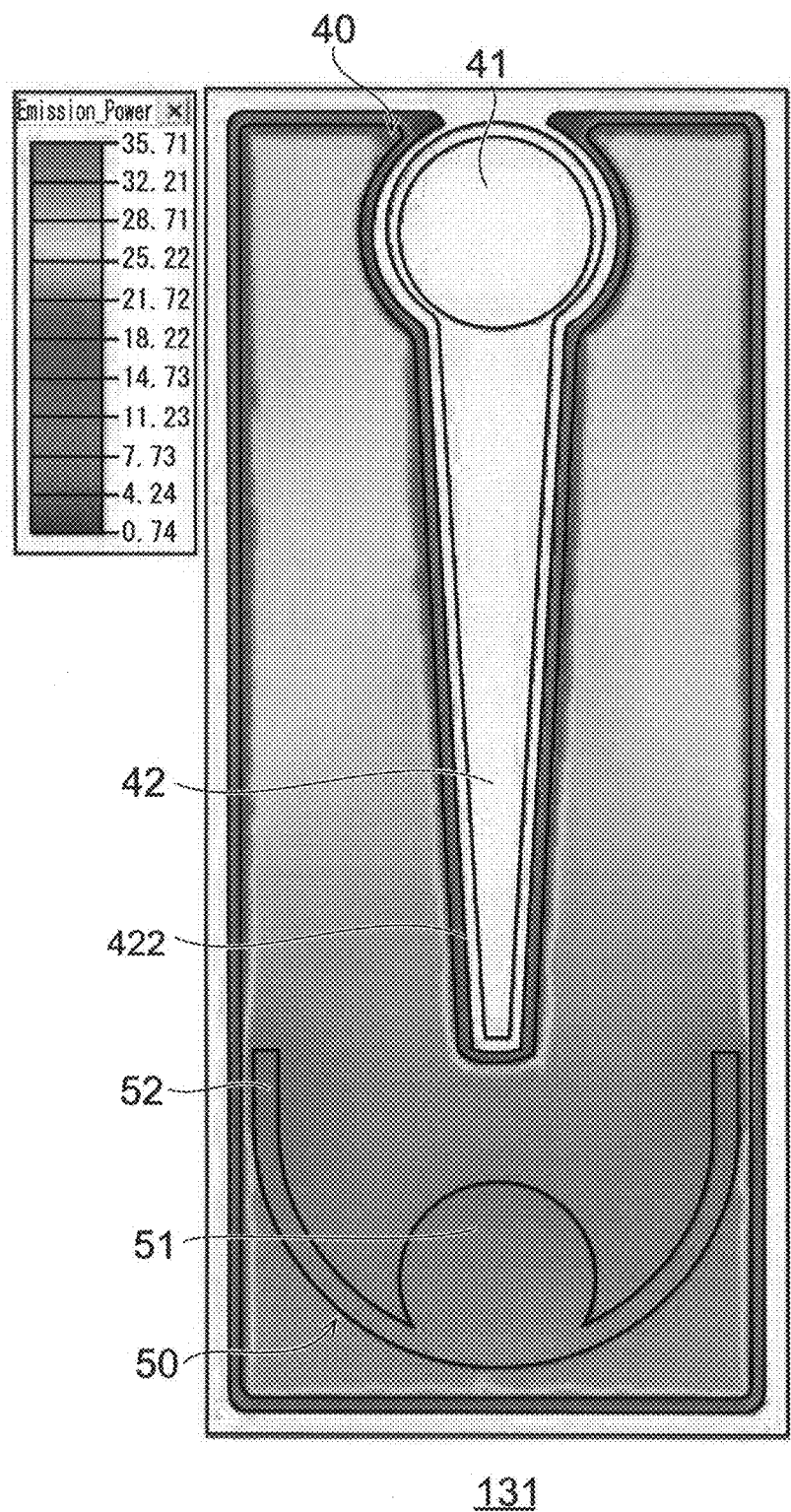
FIGS. 9A to 9F are diagrams showing characteristics of semiconductor light emitting devices.
Figure 9B:
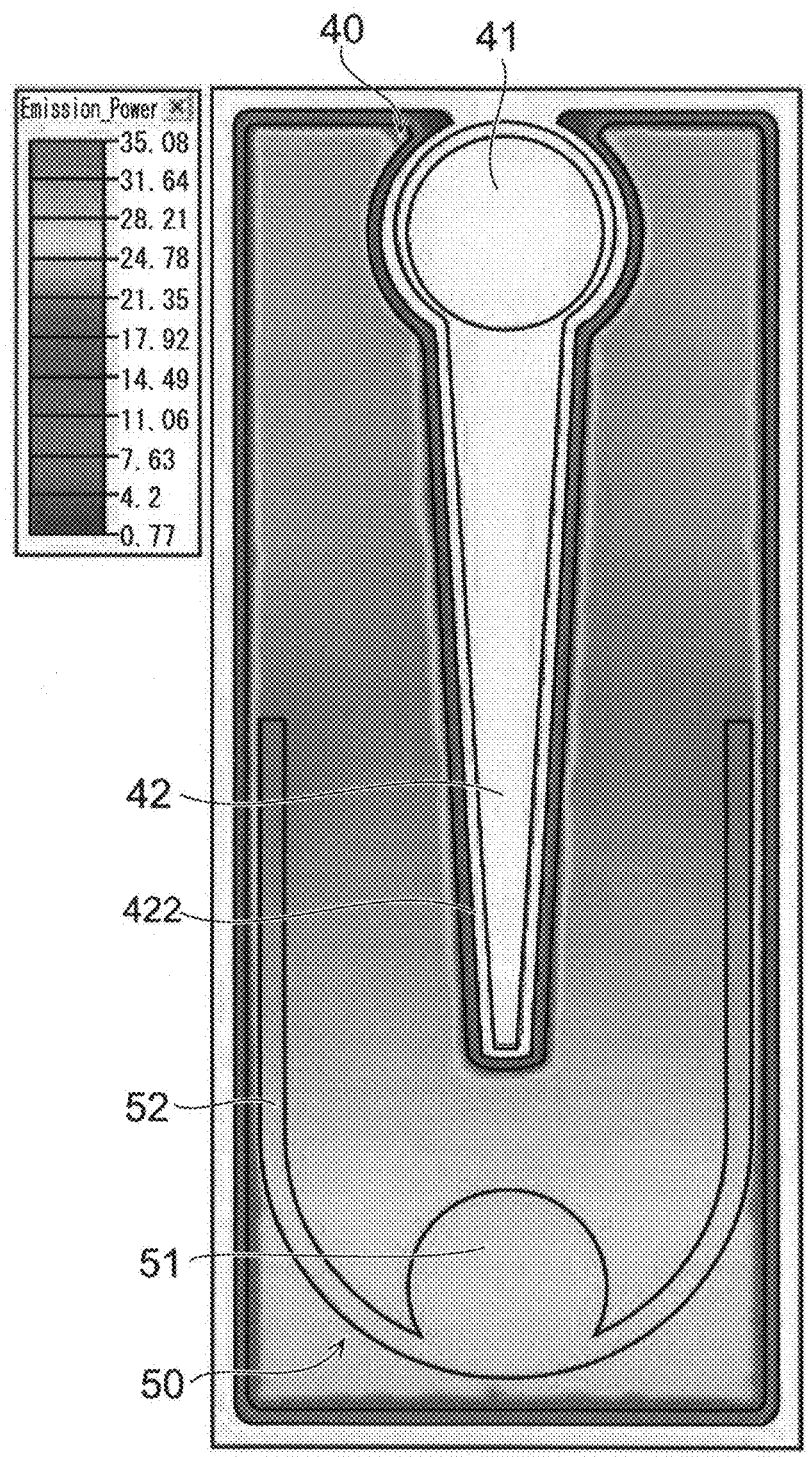
Figure 9C:
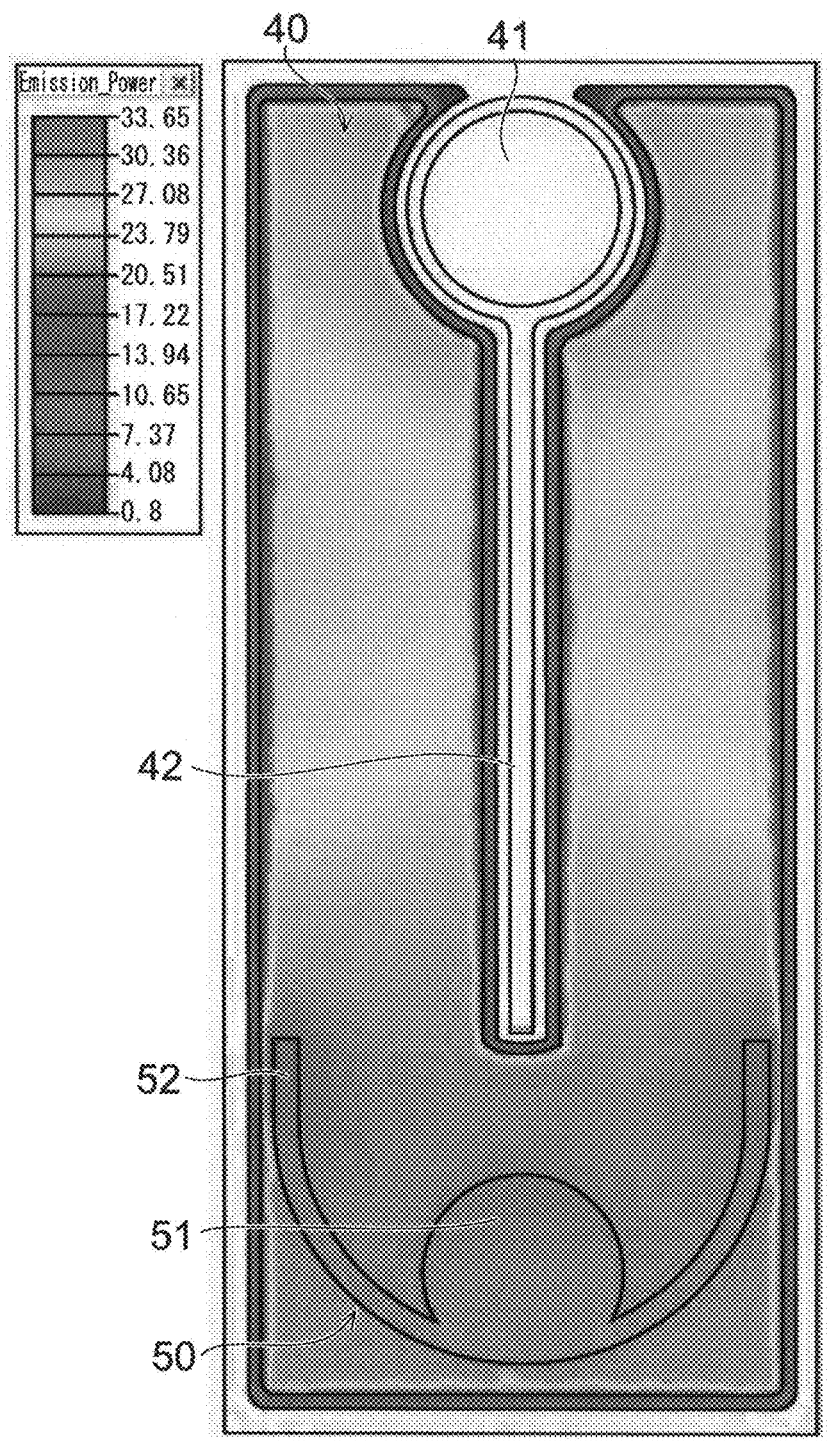

FIGS. 9A to 9C illustrate simulation results of light emission distribution in plan views of the semiconductor light emitting devices, respectively. FIGS. 9A to 9C each show that a more densely hatched portion has a higher light emission intensity.

Figure 9D:
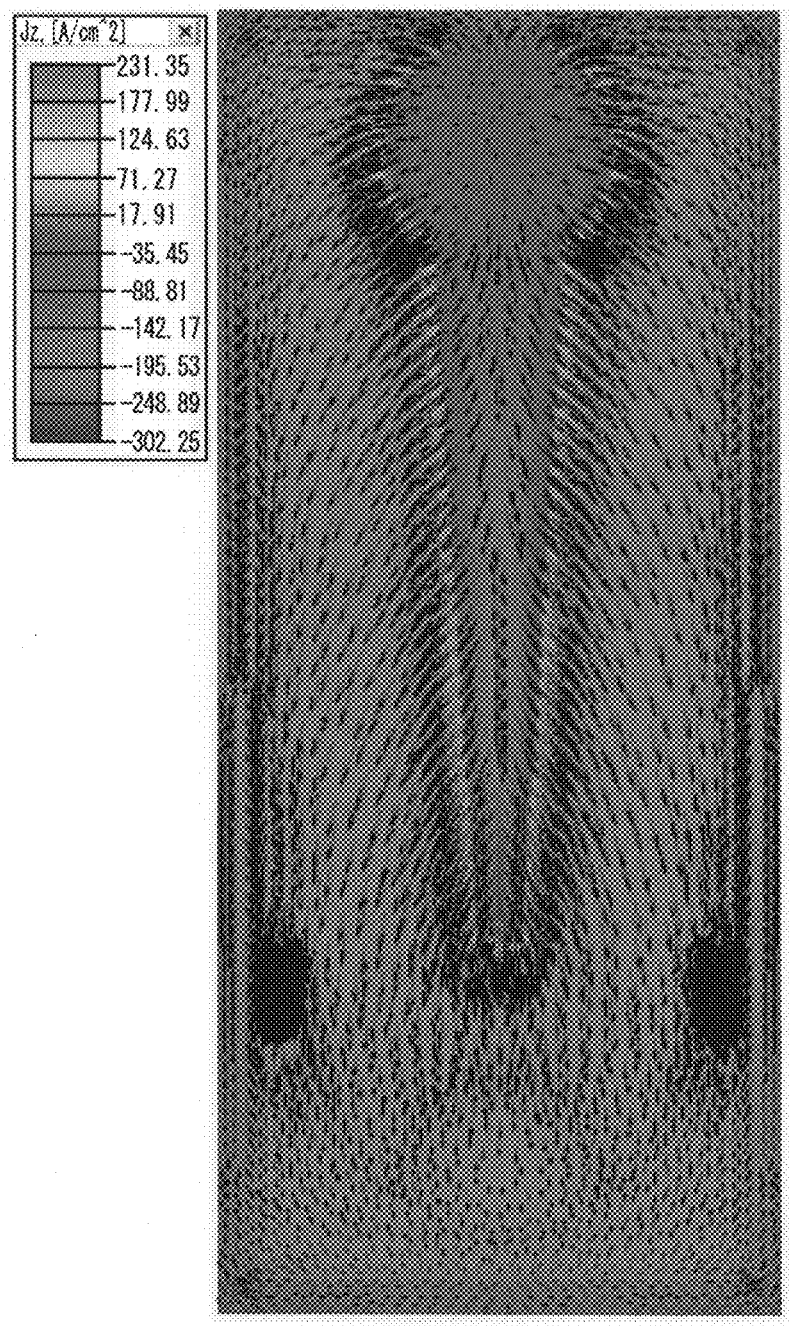
Figure 9E:
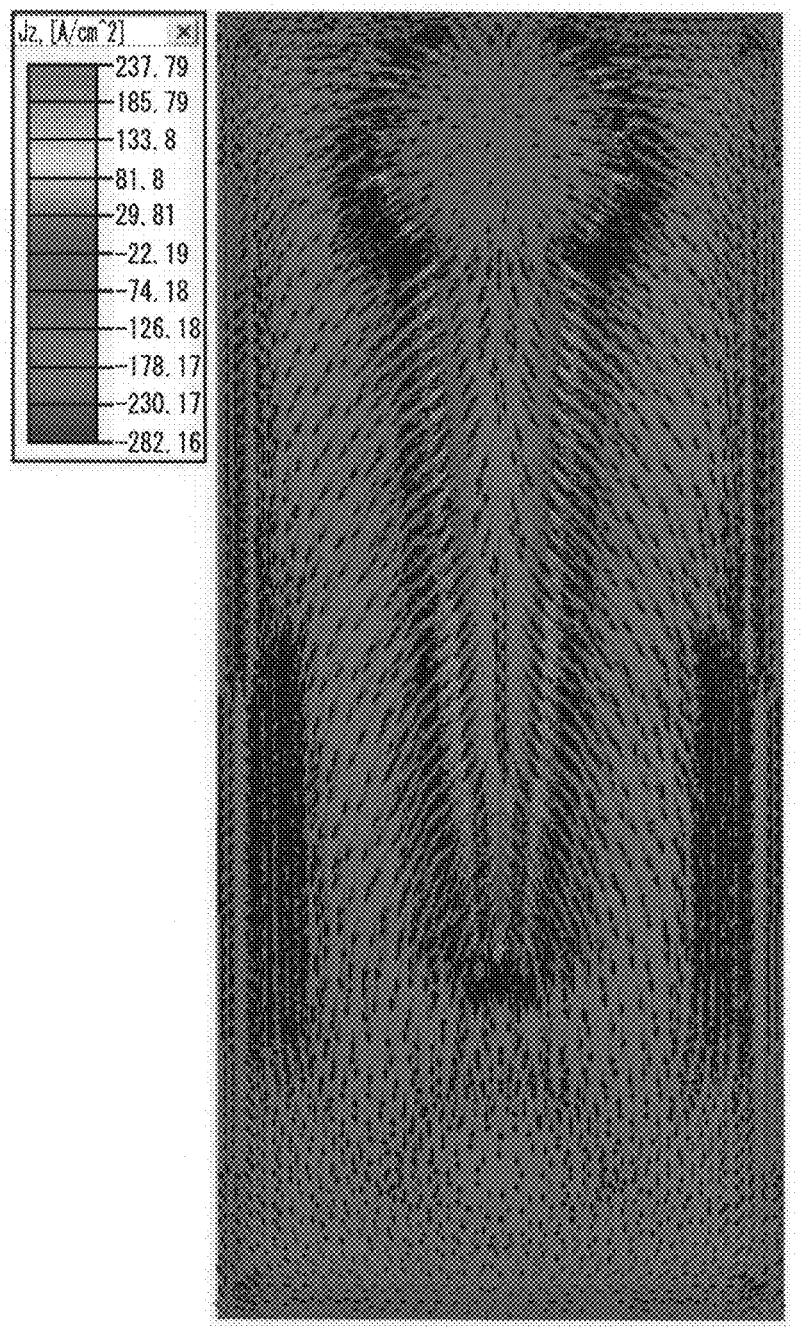
Figure 9F:
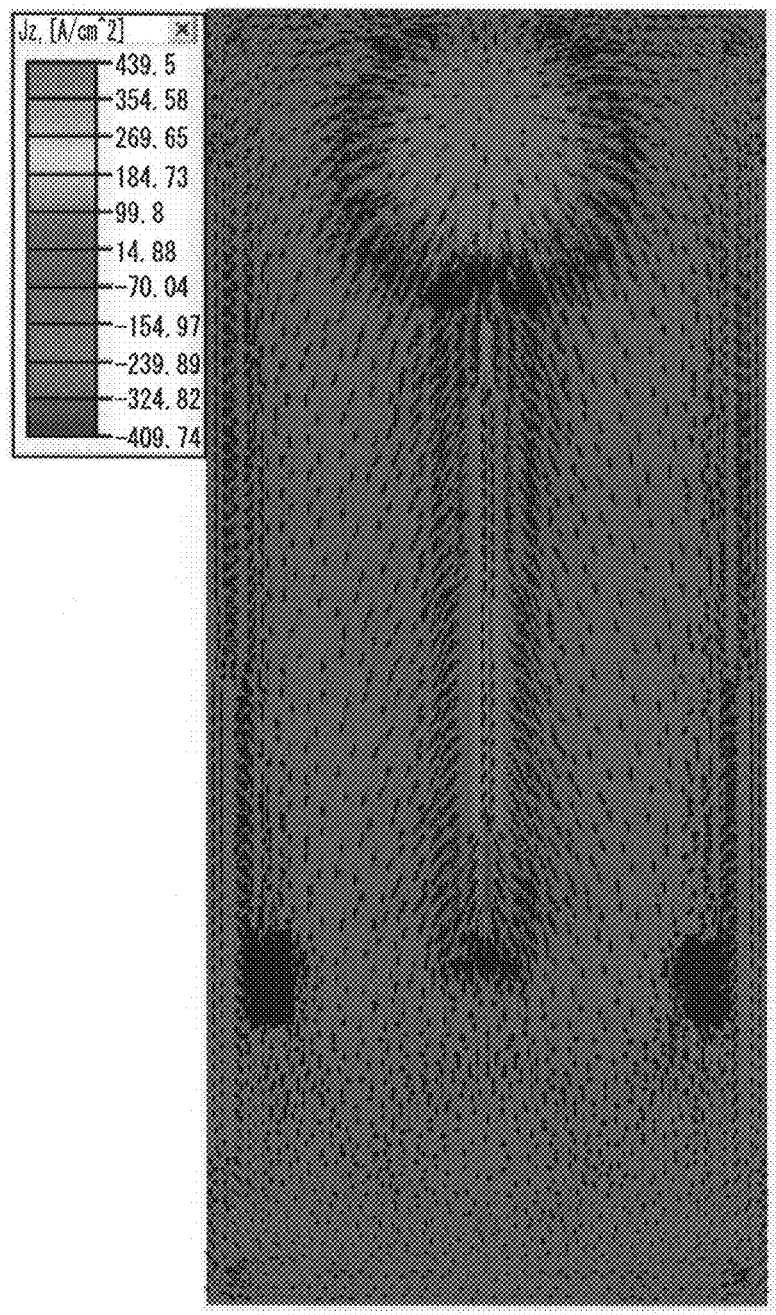

In addition, FIGS. 9D to 9F illustrate simulation results of current distribution in plan views of the semiconductor light emitting devices, respectively. FIGS. 9D to 9F each show a direction and the magnitude of a current by using a direction and the length of an arrow, respectively.

Here, FIGS. 9A and 9D correspond to a semiconductor light emitting device 131 in which a width-decreasing portion 422 is provided in a first extending portion 42. As reference, FIGS. 9B and 9E correspond to a semiconductor light emitting device 132 in which a width-decreasing portion 422 of a first extending portion 42 is the same as that of the semiconductor light emitting device 131 but the second extending portion 52 of the second electrode is longer than that of the semiconductor light emitting device 131. The semiconductor light emitting devices 131 and 132 are the semiconductor light emitting devices according to the second embodiment. In contrast, FIGS. 9C and 9F correspond to a semiconductor light emitting device 194 of a fifth comparative example in which the width of a first extending portion 42 of a first electrode 40 is constant.

As shown in FIG. 9C, the density of the hatched portion changes largely in the semiconductor light emitting device 194 of the fifth comparative example. In other words, the light emission intensity changes largely in the plane of the semiconductor light emitting device 194. In contrast, the semiconductor light emitting devices 131 and 132 each have a large area of a densely hatched portion, high light emission intensity, and uniform light emission distribution. In addition, as shown in FIGS. 9A and 9B, it is found that light emission distribution depends on the length of the second extending portions 52 of the second electrode.

As shown in FIG. 9F, the current distribution of the semiconductor light emitting device 194 of the fifth comparative example is concentrated remarkably on a specific portion. Specifically, the current distribution is concentrated on the first pad portion 41 of the first electrode 40. In contrast, as shown in FIGS. 9D and 9E, the concentration of the current distribution is suppressed in the semiconductor light emitting devices 131 and 132. In addition, as shown in FIGS. 9D and 9E, it is found that the deconcentration of the current distribution depends on the length of the second extending portions 52 of the second electrode.

With reference to an operating voltage of the semiconductor light emitting device 194 of the fifth comparative example, the semiconductor light emitting device 131 has an operating voltage of 0.991; and the semiconductor light emitting device 132 has an operating voltage of 0.975.

As described above, in the semiconductor light emitting device 130 (131 and 132) according to the second embodiment, the deconcentration of the current density distribution between the first electrode 40 and the second electrode 50 can be achieved as compared to the semiconductor light emitting device 195 in which the width-decreasing portion 422 is not provided in the first extending portion 42 of the first electrode 40. Thereby, uniformity in light emission distribution is achieved in the semiconductor light emitting device 130 (131 and 132).

Figure 10:
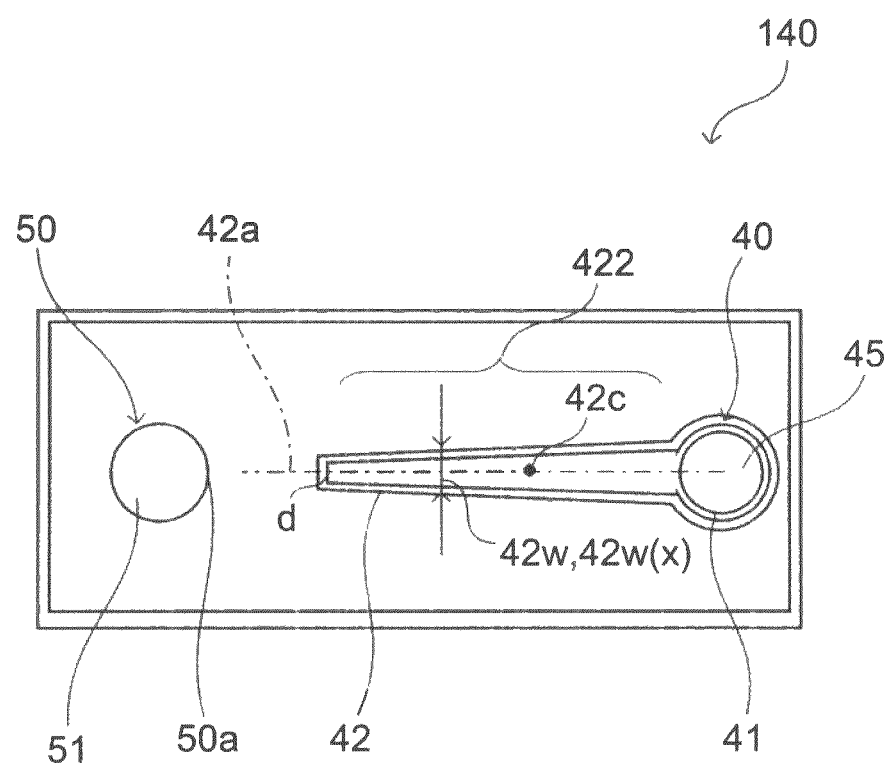
FIGS. 10 to 12B are schematic plan views showing semiconductor light emitting devices.

FIG. 10 is a schematic plan view illustrating the configuration of another semiconductor light emitting device 140 according to the second embodiment.

FIG. 10 illustrates the plan shapes of a first electrode 40 and a second electrode 50.

In the semiconductor light emitting device 140 as shown in FIG. 10, the second electrode 50 includes a second pad portion 51. That is, the semiconductor light emitting device 140 is different from the semiconductor light emitting device 130 shown in FIG. 8 in that the second electrode 50 does not have the second extending portion 52.

However, the positional relationship between the second electrode 50 and a first extending portion 42 of the first electrode 40 in the semiconductor light emitting device 140 is the same as that in the semiconductor light emitting device 130. In other words, an end portion 50a of the second electrode 50 closest to a first pad portion 41 of the first electrode 40 is located closer to an end of the first extending portion 42 than a center position 42c of the first extending portion 42 in an extending direction 42a. In the second electrode 50 of the semiconductor light emitting device 140, the end portion 50a closest to the first pad portion 41 of the first electrode 40 is an end portion of the second pad portion 51 of the second electrode 50.

In the semiconductor light emitting device 140 as described above, the first extending portion 42 includes the width-decreasing portion 422. Specifically, in the width-decreasing portion 422, a width 42w of the first extending portion 42 is gradually decreased from the first pad portion 41 to an end d of the first extending portion 42. The width 42w of the width-decreasing portion 422 may be decreased continuously, or may be decreased discontinuously (stepwise).

In the semiconductor light emitting device 140 in which the second extending portions 52 are not provided in the second electrode 50, an electric field is concentrated on around the second pad portion 51 of the second electrode 50, and thus the width of the first extending portion 42 is made smaller toward the end portion d. This can alleviate the concentration of the electric field. Accordingly, in the semiconductor light emitting device 140, uniformity in light emission distribution is achieved by deconcentration of the current density distribution.

Third Embodiment

FIGS. 11A to 12B are schematic plan views illustrating semiconductor light emitting devices according to a third embodiment.

FIGS. 11A to 12B each illustrate the plan shapes of a first electrode 40 and a second electrode 50.

In FIGS. 11A to 12B each illustrate the semiconductor light emitting device in which a first pad portion 41 of the first electrode 40 and a second pad portion 51 of the second electrode 50 are arranged to face each other on a diagonal line in a plan view.

Figure 11A:
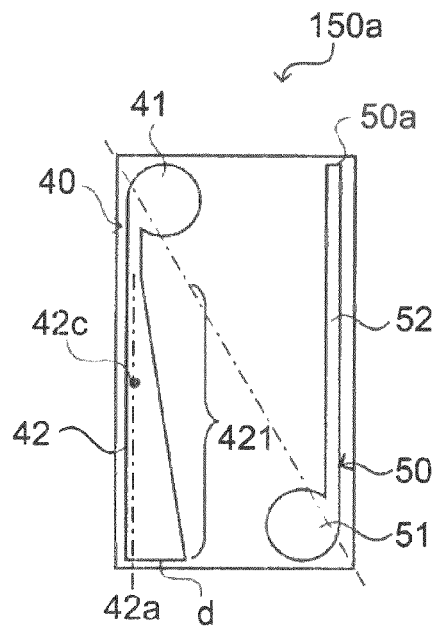
Figure 11B:
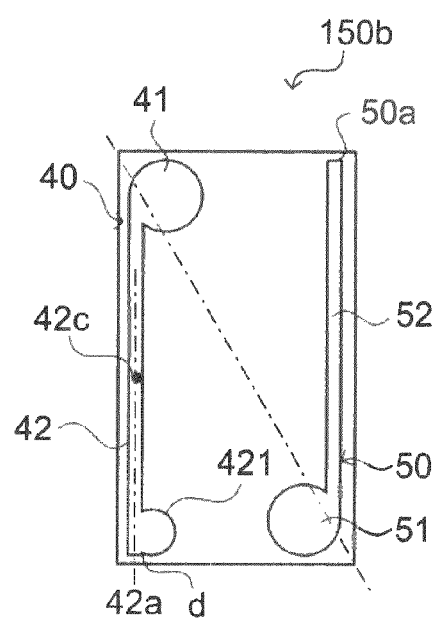
Figure 11C:
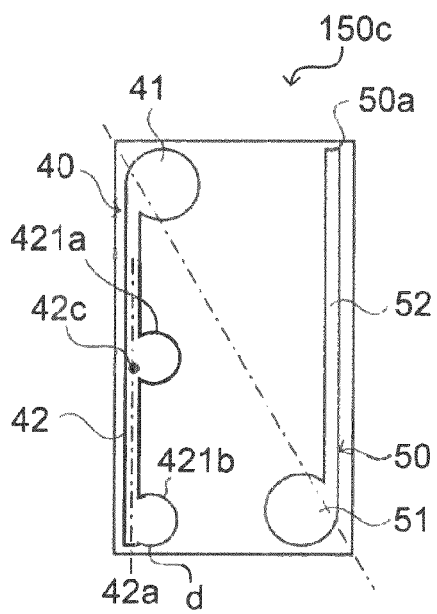

In each of semiconductor light emitting devices 150a to 150c illustrated in FIGS. 11A to 11C, a first extending portion 42 and a second extending portion 52 extend from the first pad portion 41 and the second pad portion 51, respectively, in directions opposite to each other.

Figure 12A:
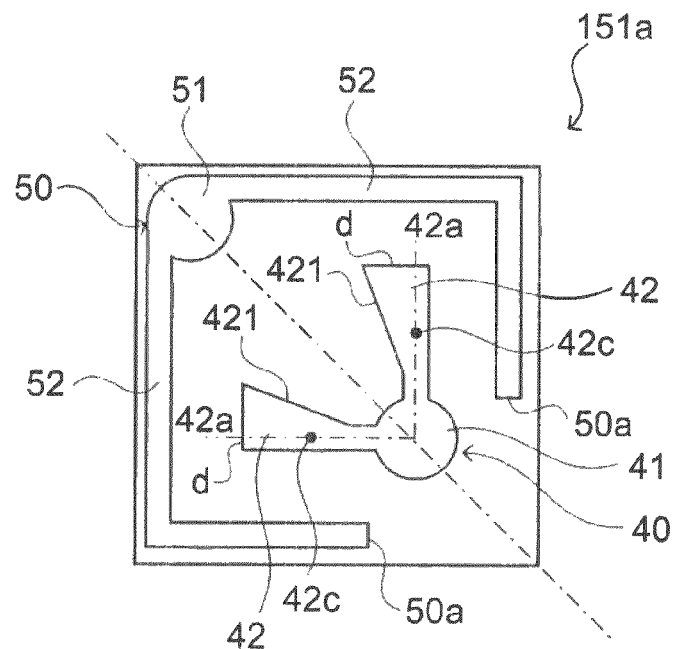
Figure 12B:
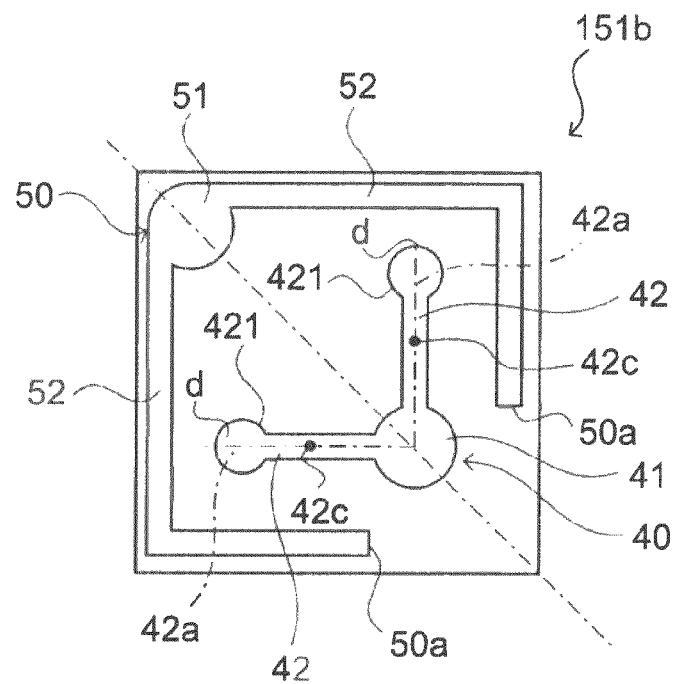

In each of semiconductor light emitting devices 151a and 151b illustrated in FIGS. 12A and 12B, two first extending portions 42 extend from the first pad portion 41 in directions orthogonal to each other, and two second extending portions 52 extend from the second pad portion 51 in directions orthogonal to each other.

In each of the semiconductor light emitting devices 150a to 151b illustrated in FIGS. 11A to 12B, an end portion 50a of the second electrode 50 closest to the first pad portion 41 of the first electrode 40 is located closer to the first pad portion 41 than a center position 42c of the first extending portion 42 in an extending direction 42a. Accordingly, in a width-increasing portion 421, a width 42w of the first extending portion 42 is gradually increased from the first pad portion 41 toward an end d of the first extending portion 42.

In the semiconductor light emitting device 150a illustrated in FIG. 11A, the width-increasing portion 421 is provided in the first extending portion 42 extending from the first pad portion 41 of the first electrode 40. The length (width) of the width-increasing portion 421 in a direction orthogonal to the extending direction 42a is linearly increased from the first pad portion 41 toward the end d. The width of the width-increasing portion 421 may be increased continuously, or may be increased discontinuously (stepwise).

In the semiconductor light emitting device 150b illustrated in FIG. 11B, a circular expanded portion is provided on the end d side of the first extending portion 42 extending from the first pad portion 41 of the first electrode 40. A half of the expanded portion on the first pad portion 41 side serves as the width-increasing portion 421. In other words, the length (width) of the width-increasing portion 421 in a direction orthogonal to the extending direction 42a is increased from the first pad portion 41 toward the end d. The expanded portion of the first extending portion 42 may have an elliptic shape.

As shown in FIG. 11C, the semiconductor light emitting device 150c has circular expanded portions respectively midway through and on the end d side of the first extending portion 42. Halves of the respective expanded portions on the first pad portion 41 side serve as width-increasing portions 421a and 421b. In other words, the lengths (widths) in a direction orthogonal to the extending direction 42a of the width-increasing portions 421a and 421b are gradually increased from the first pad portion 41 toward the end d. The expanded portions of the first extending portion 42 may have an elliptic shape. In addition, three or more expanded portions may be provided in the first extending portion 42.

In the semiconductor light emitting device 151a illustrated in FIG. 12A, each of the two first extending portions 42 extending from the first pad portion 41 of the first electrode 40 is provided with the width-increasing portion 421. The length (width) of the width-increasing portion 421 in a direction orthogonal to the extending direction 42a is linearly increased from the first pad portion 41 toward the end d. The width of the width-increasing portion 421 may be increased continuously, or may be increased discontinuously (stepwise).

In the semiconductor light emitting device 151b shown in FIG. 12B, each of the two first extending portions 42 extending from the first pad portion 41 of the first electrode 40 is provided with a circular expanded portion on the end d side of the first extending portion 42. A half of the expanded portion on the first pad portion 41 side serves as the width-increasing portion 421. In other words, the length (width) in a direction orthogonal to the extending direction 42a of the width-increasing portion 421 is gradually increased from the first pad portion 41 toward the end d. The expanded portion of the first extending portion 42 may have an elliptic shape. In addition, two or more expanded portions of the first extending portion 42 may be provided including ones provided midway through the first extending portion 42.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as first semiconductor layers, second semiconductor layers, light emitting portions, first electrodes, second electrodes, supporting substrates are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices practicable by an appropriate design modification by one skilled in the art based on the semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device comprising:
a stacked structural body including:
    a first semiconductor layer of a first conductivity type, the first semiconductor layer having a major face, a first portion provided on the major face and a second portion provided on the major face;
    a second semiconductor layer of a second conductivity type, the second semiconductor layer provided on the first portion; and
    a light emitting portion provided between the first portion of the first semiconductor layer and the second semiconductor layer;
a first electrode provided on the second portion of the first semiconductor layer; and
a second electrode provided on the second semiconductor layer,
the first electrode including:
    a first pad portion; and
    a first extending portion extending from the first pad portion along a first extending direction;
the first extending portion including a first width-increasing portion, a width of the first width-increasing portion along a direction orthogonal to the first extending direction being increased from the first pad portion toward an end of the first extending portion;
wherein
the second electrode includes:
    a second pad portion;
    a second extending portion extending from the second pad portion, at least a part of the second extending portion extending along a second extending direction; and
a third extending portion extending from the second pad portion, at least a part of the third extending portion extending along a third extending direction different from the second extending direction;
wherein
the first conductivity type is n-type,
the second conductivity type is p-type,
the second extending portion and the third extending portion extend from a position of the second pad portion which is receded from a position which is closest to the first extending portion,
the width of the first width-increasing portion along a direction orthogonal to the first extending direction gradually increases from a start position toward an end position, the start position being on a side of the first pad from a center position along the first extending direction in the first extending portion, and the end position being an end of the first extending portion.

2. The device according to claim 1, wherein
a distance between the first pad portion and an end portion of the second electrode closest to the first pad portion is less than a distance between the first pad portion and a center of the first extending portion along the first extending direction.

3. The device according to claim 1, wherein
the width of the first width-increasing portion is increased continuously.

4. The device according to claim 1, wherein
the width of the first width-increasing portion is increased in a stepwise manner.

5. The device according to claim 1, wherein
the third extending direction is opposite to the second extending direction.

6. The device according to claim 1, wherein the second extending portion is curved midway, and the third extending portion is curved midway.

* * * * *